United States Patent [19]
Yamazaki et al.

[11] Patent Number: 6,127,702
[45] Date of Patent: Oct. 3, 2000

[54] SEMICONDUCTOR DEVICE HAVING AN SOI STRUCTURE AND MANUFACTURING METHOD THEREFOR

[75] Inventors: Shunpei Yamazaki, Tokyo; Hisashi Ohtani, Kanagawa; Jun Koyama, Kanagawa; Takeshi Fukunaga, Kanagawa, all of Japan

[73] Assignee: Semiconductor Energy Laboratory Co., Ltd., Kanagawa-ken, Japan

[21] Appl. No.: 08/931,697

[22] Filed: Sep. 16, 1997

[30] Foreign Application Priority Data

Sep. 18, 1996 [JP] Japan .................................. 8-269215

[51] Int. Cl.⁷ ...................... H01L 27/01; H01L 27/12; H01L 29/76; H01L 29/94
[52] U.S. Cl. .............................. 257/347; 257/345
[58] Field of Search ................. 438/289; 257/347, 257/353, 345

[56] References Cited

U.S. PATENT DOCUMENTS

| | | | |
|---|---|---|---|
| 4,959,697 | 9/1990 | Shier et al. | 257/279 |
| 4,999,682 | 3/1991 | Xu et al. | 257/13 |
| 5,210,437 | 5/1993 | Sawada et al. | 257/392 |
| 5,894,137 | 4/1999 | Yamazaki et al. | 257/66 |

FOREIGN PATENT DOCUMENTS

WO 88/03328 A1 5/1988 WIPO.

*Primary Examiner*—Brian Dutton
*Attorney, Agent, or Firm*—Fish & Richardson P.C.

[57] ABSTRACT

A fine semiconductor device having a short channel length while suppressing a short channel effect. Linearly patterned or dot-patterned impurity regions 104 are formed in a channel forming region 103 so as to be generally parallel with the channel direction. The impurity regions 104 are effective in suppressing the short channel effects. More specifically, the impurity regions 104 suppress expansion of a drain-side depletion layer, so that the punch-through phenomenon can be prevented. Further, the impurity regions cause a narrow channel effect, so that reduction in threshold voltage can be lessened.

35 Claims, 18 Drawing Sheets

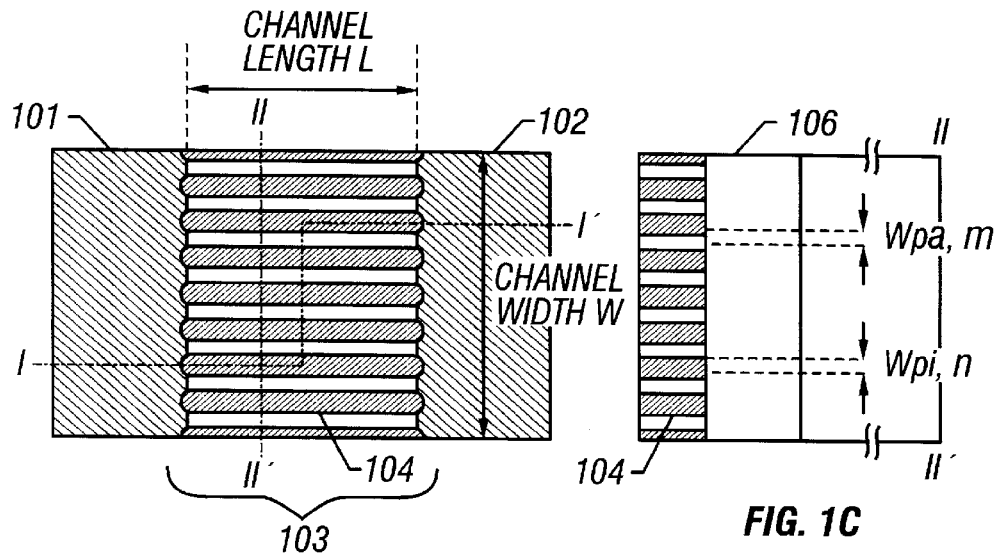
FIG. 1A
FIG. 1C
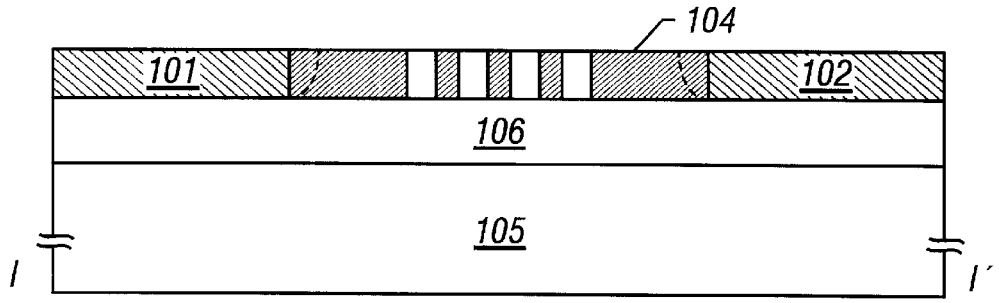
FIG. 1B
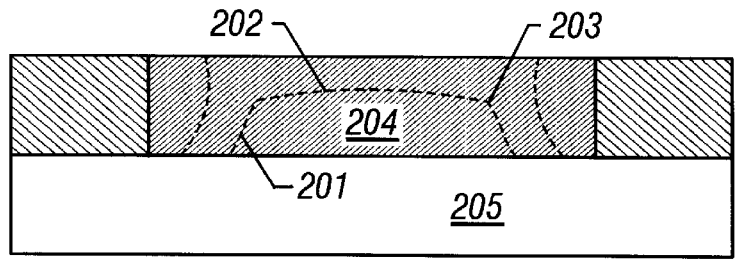
FIG. 2A
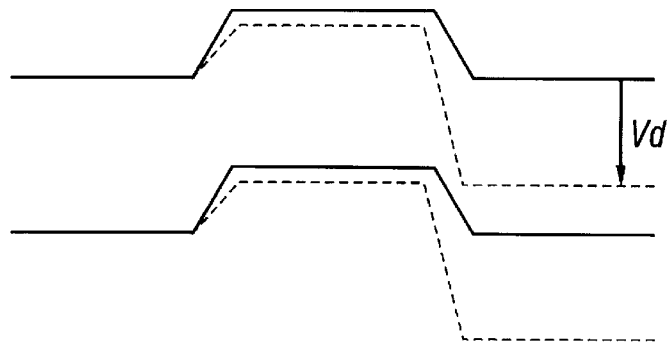
FIG. 2B

N-CHANNEL FET          P-CHANNEL FET

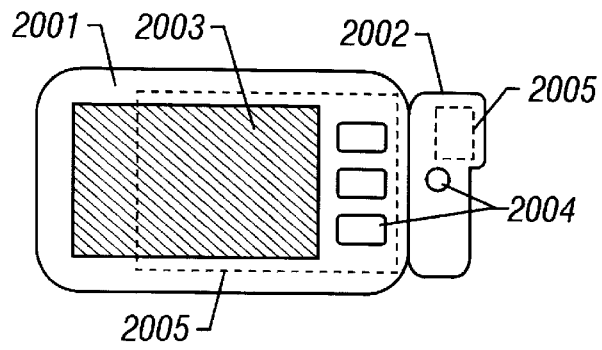
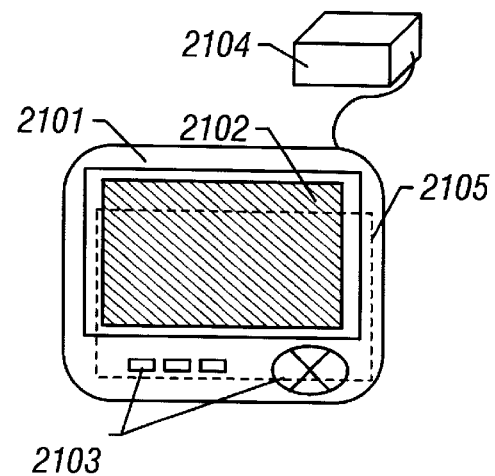
FIG. 21A
FIG. 21B
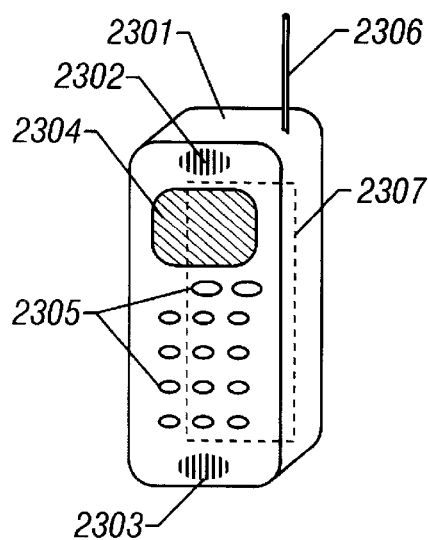
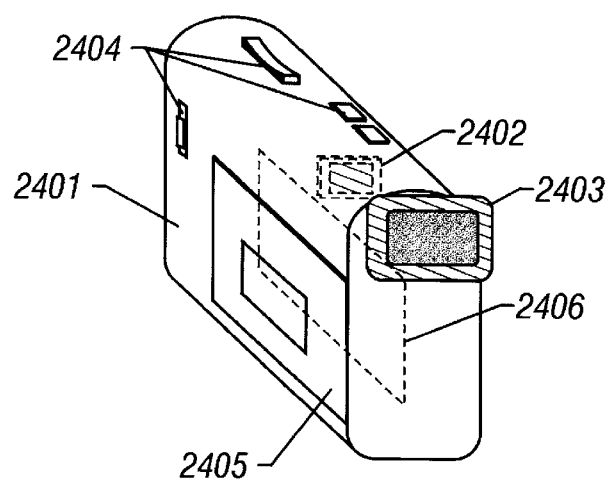
FIG. 21C
FIG. 21D

SEMICONDUCTOR DEVICE HAVING AN SOI STRUCTURE AND MANUFACTURING METHOD THEREFOR

BACKGROUND OF THE INVENTION

1. Field of the Invention

The present invention relates to a structure and a manufacturing method of an insulated-gate semiconductor device having an SOI (silicon-on-insulator) structure, particularly an insulated-gate field-effect transistor (hereinafter referred to simply as IG-FET). An example of the insulated-gate semiconductor device having a SOI structure is a semiconductor device formed on an SOS (silicon-on-sapphire) substrate or a SIMOX (separated-by-implanted oxygen) substrate.

In particular, the invention relates to a technique that is effective in forming a very small element having a channel length of less than 0.35 μm (particularly less than 0.1 μm). Thus, the invention can be applied to various semiconductor integrated circuits such as ICs, VLSIs, and ULSIs that are formed by integrating IG-FETs.

The term "semiconductor device" as used in this specification means a "device or apparatus that utilizes a semiconductor to operate for an intended purpose," and covers not only semiconductor elements such as an IG-FET but also integrated circuits formed by integrating semiconductor elements, and even electronic apparatuses incorporating such integrated circuits. In the specification, for convenience of description, various terms such as a semiconductor element, an integrated circuit, and an electronic apparatus are used where appropriate.

2. Description of the Related Art

In recent years, integrated circuits such as VLSIs are being miniaturized steadily, and the width of interconnections comes to decrease to 0.35–0.1 μm or less than 0.35 μm, or even to less than 0.01 μm (dimensions of a deep submicron processing range).

On the other hand, low power consumption is also required, which makes the lower power consumption characteristic of CMOS ICs indispensable. Where a CMOS IC is miniaturized, a problem of a latch-up phenomenon may occur between an n-type FET and a p-type FET. IG-FETs having an SOI structure solve this problem.

Because of complete insulation between a substrate and an element, IG-FETs having an SOI structure can greatly reduce a parasitic capacitance occurring there and hence allow pursuit of high-speed operation.

Thus, semiconductor devices having an SOI structure now attract much attention as next-generation high-speed elements and demand for those is expected to increase further in the future.

Such semiconductor elements have been miniaturized according to the scaling rule, and it is generally known that miniaturization an integrated circuit leads to improvements in its characteristics. However, in microprocessing in a submicron range, problems may occur where the scaling rule does not apply in simple form.

A typical example of such problems is the short channel effects. The short channel effects are caused by a phenomenon that as the width of the gate electrode becomes shorter, that is, the channel forming region becomes shorter, the charge in the channel forming region, which should be controlled by the gate voltage, comes to be also influenced by the depletion layer charge and electric field and the potential profile in the source/drain region.

FIG. 3 shows the above phenomenon in a simplified manner. FIG. 3 shows a conventional semiconductor device formed on a SIMOX substrate in which reference numerals 301 and 302 denote a silicon substrate and a buried oxide layer formed by oxygen implantation, respectively. A crystalline semiconductor layer (single crystal silicon layer) is disposed on the buried oxide layer 302, and a source region 303, a drain region 304, a channel region 305, and a gate electrode 306 are formed in or on the crystalline semiconductor layer. A broken line 307 denotes a depletion layer that is formed when the drain voltage Vd is small.

Normally, the current flowing through the channel region 305 is controlled only by the gate voltage Vg. In this case, the portion of the depletion layer (indicated by the broken line 307) in the vicinity of the channel region 305 is substantially parallel with the channel, to allow formation of a uniform electric field.

However, as the drain voltage Vd is increased, the depletion layer in the vicinity of the drain region 304 extends toward the channel region 305 and the source region 303, so that the charge and the electric field in the drain depletion layer come to influence the depletion layer in the vicinity of the source region 303 and the channel region 305 as indicated by a solid line 308. As a result, the on-current varies depending on a complex electric field profile and is hard to control only by the gate voltage Vg.

Referring to FIG. 4, a description will be made of an energy state in and around the channel forming region in a state that the short channel effects occur. In FIG. 4, solid lines represent an energy band diagram including a source region 401, a channel forming region 402, and a drain region 403 in a state that the drain voltage Vd is 0 V.

When a sufficiently large drain voltage Vd is applied, the energy band diagram changes to one indicated by broken lines in FIG. 4. That is, the depletion layer charge and electric field in the drain region 403 formed by the drain voltage Vd influence the depletion layer charge in the source region 401 and the channel forming region 402, and the energy (potential) profile varies continuously from the source region 401 to the drain region 403.

In semiconductor elements, say, IG-FETs, the short-channel effects typically appear as a reduction in threshold voltage Vth and a reduction in device breakdown voltage due to the punch-through phenomenon. It is known that if the degree of influence of the gate voltage on the drain current is lowered by the punch-through phenomenon, the subthreshold characteristic is deteriorated.

The reduction in threshold voltage occurs in both n-channel and p-channel FETs in similar manners. The degree of the threshold voltage reduction depends on not only the drain voltage but also other various parameters such as the substrate impurity concentration, the source/drain diffusion layer depth, the gate oxide film thickness, and the substrate bias voltage.

Although the reduction in threshold voltage is desirable for the purpose of reducing the power consumption, in general a resulting reduction in the drive voltage of an integrated circuit causes demerits such as a difficulty in improving the frequency characteristic.

Further, when the channel length is shortened, the drain-side depletion layer is connected to the source-side depletion layer to lower the diffusion potential in the vicinity of the source, which in turn causes a current flow between the source and the drain even if a channel is not formed there. This is called the punch-through phenomenon.

When the punch-through phenomenon occurs, the drain current is not saturated even in the saturation range. Since a large current comes to flow as the drain voltage is increased, the source-drain breakdown voltage is considerably reduced which is a problem.

The deterioration in subthreshold characteristic due to the punch-through phenomenon means an increase in subthreshold coefficient (S-value), which in turn means deterioration in the switching characteristic of a FET. FIG. 5 shows an influence of the short channel effects appearing in the subthreshold characteristic.

FIG. 5 is a graph in which the horizontal axis represents the gate voltage Vg and the vertical axis represents the drain current Id. The S-value is the reciprocal of the slope (i.e., subthreshold characteristic) in range 501. FIG. 5 shows how the characteristic varies as the channel length is shortened gradually in the arrowed direction.

It is seen that the slope of the characteristic decreases (the S-value increases) as the channel length is shortened, which means that the switching characteristic of a FET is more deteriorated as the channel length is shortened.

Various techniques have been proposed as means for suppressing the above-described short channel effects. For example, it was reported that in an SOI structure in which a substrate and an element are insulated from each other by a buried oxide film (by using a bonding technique, ion implantation, or some other technique), thinning the buried oxide film is effective in suppressing the short channel effects. However, this technique does not provide a complete solution.

A semiconductor device having an SOI structure in which the channel length is very short, i.e., about 0.1 µm has a feature that impurity elements exist in the channel region at an extremely low probability (from one to some). Even at the room temperature, a phenomenon was observed that electrons move faster than in the ordinary case (the velocity overshoot effect; see K. Ohuchi et al., Jpn. J. Appl. Phys., Vol. 35, pp. 960, 1996).

A high-speed semiconductor device was proposed whose high-speed operation performance was improved by utilizing the above effect. However, in such a high-speed semiconductor device, at present, the problems such as the punch-through phenomenon as one of the short channel effects and the associated deterioration in breakdown voltage (described above) remain unsolved.

As a means for suppressing the reduction in threshold voltage as one of the short channel effects, a technique has been employed in which an impurity element imparting one type of conductivity is added uniformly to the overall channel forming region and the threshold voltage is controlled by its addition amount. However, this method has a problem of a reduction in carrier mobility because the added impurity scatters carriers.

A single crystal silicon substrate as a mother substrate of an SOI substrate is manufactured by a FZ method with a very low oxygen content or a CZ method which allows oxygen to be contained to a certain extent to reduce stress and prevent a warp. Usually, a single crystal silicon substrate by the CZ method is used for memory ICs and logic ICs.

However, in a single crystal silicon substrate manufactured by the CZ method, the amount of warp increases due to a heat history and other factors as the oxygen (usually, about $1-2\times10^{18}$ atoms/cm$^3$) that the amount of warp becomes sufficiently small, there may occur a case that oxygen atoms prevent movement of carriers.

In the current semiconductor industry, semiconductor integrated circuits that are integrated to an extreme, and the key point for this purpose is to what extent each semiconductor element can be miniaturized. However, even if a technique for forming a fine pattern in the deep submicron range were developed, the above-described problems of the short channel effects would be fatal obstructions to the miniaturization of semiconductor elements.

SUMMARY OF THE INVENTION

The present invention has been made to solve the above problems in the art, and an object of the invention is therefore to provide a technique for effectively suppressing the short channel effects due to miniaturization of semiconductor elements. The invention is intended to enable formation of very small elements in the deep submicron range which have been difficult to form conventionally due to the short channel effects.

According to the invention, there is provided an insulated-gate semiconductor device having a SOI structure, comprising a source region, a drain region, and a channel forming region that are formed by using a crystalline semiconductor formed on an insulative substrate or an insulating layer; and a gate insulating film and a gate electrode formed on the channel forming region, the channel forming region comprising carrier movement regions; and impurity regions formed artificially and locally for pinning of a depletion layer developing from the drain region toward the channel forming region and the source region, the impurity regions containing an impurity element for shifting an energy band in such a direction that movement of electrons is obstructed.

Further, there is provided an insulated-gate semiconductor device having a SOI structure, comprising a source region, a drain region, and a channel forming region that are formed by using a crystalline semiconductor formed on an insulative substrate or an insulating layer; and a gate insulating film and a gate electrode formed on the channel forming region, the channel forming region comprising carrier movement regions; and impurity regions formed artificially and locally for pinning of a depletion layer developing from the drain region toward the channel forming region and the source region, the impurity regions containing an impurity element for shifting an energy band in such a direction that movement of holes is obstructed.

Further, there is provided an insulated-gate semiconductor device having a SOI structure, comprising a source region, a drain region, and a channel forming region that are formed by using a crystalline semiconductor formed on an insulative substrate or an insulating layer; and a gate insulating film and a gate electrode formed on the channel forming region, the channel forming region comprising carrier movement regions; and impurity regions formed artificially and locally by adding an impurity element to control a threshold voltage to a given value, the impurity element shifting an energy band in such a direction that movement of electrons is obstructed.

Still further, there is provided an insulated-gate semiconductor device having a SOI structure, comprising a source region, a drain region, and a channel forming region that are formed by using a crystalline semiconductor formed on an insulative substrate or an insulating layer; and a gate insulating film and a gate electrode formed on the channel forming region, the channel forming region comprising carrier movement regions; and impurity regions formed artificially and locally by adding an impurity element to control a threshold voltage to a given value, the impurity element shifting an energy band in such a direction that movement of holes is obstructed.

According to another aspect of the invention, there is provided a manufacturing method of an insulated-gate semiconductor device having an SOI structure, comprising the steps of forming a crystalline semiconductor on an insulative substrate or an insulating layer; forming a source region, a drain region, and a channel forming region by using the crystalline semiconductor; forming impurity regions artificially and locally in the channel forming region so that the channel forming region includes carrier movement regions and the impurity regions by adding, to the channel forming region, an impurity element for shifting an energy band in such a direction that movement of electrons is obstructed; and forming a gate insulating film and a gate electrode on the channel forming region.

Further, there is provided a manufacturing method of an insulated-gate semiconductor device having an SOI structure, comprising the steps of forming a crystalline semiconductor on an insulative substrate or an insulating layer; forming a source region, a drain region, and a channel forming region by using the crystalline semiconductor; forming impurity regions artificially and locally in the channel forming region so that the channel forming region includes carrier movement regions and the impurity regions by adding, to the channel forming region, an impurity element for shifting an energy band in such a direction that movement of holes is obstructed; and forming a gate insulating film and a gate electrode on the channel forming region.

The main point of the invention is to effectively suppress a depletion layer developing from the drain region toward the channel forming region by the impurity regions that are formed artificially and locally in the channel forming region, to thereby prevent various problems of the short channel effects such as the punch-through phenomenon, deterioration of the subthreshold characteristic, and decrease in breakdown voltage.

The present inventors call a device according to the invention a "pinning semiconductor device" based on an analogy to formation of pins (corresponding to the impurity regions) in the channel forming regions. In this specification, "pinning" means "prevention" and the verb "to pin" is used to mean "to prevent."

That is, the impurity regions are formed locally in the channel forming region and utilized as energy barriers. By utilizing the impurity regions as energy barriers, the drain region side depletion layer is prevented, in terms of energy, from expanding toward the channel forming region side, whereby an electric field formed in the channel forming region is allowed to be controlled only by the gate voltage.

In the invention, the impurity regions are formed by using an impurity element that shifts the energy band in such a direction that the movement of carriers (electrons or holes) is obstructed. In the case of an n-channel FET, an element belonging to group 13 (typically, boron) may be used as such an impurity element. In the case of a p-channel FET, an element belonging to group 15 (typically, phosphorus or arsenic) may be used as such an impurity element.

The impurity regions formed by adding the above impurity element can shift the energy band of the channel forming region, and thereby change the threshold voltage to the positive or negative side. Therefore, the concentration of the added impurity element should be at least a level that enables threshold voltage control (typically $1 \times 10^{17}$ to $1 \times 10^{20}$ atoms/cm$^3$, and preferably $1 \times 10^{18}$ to $1 \times 10^{19}$ atoms/cm$^3$).

To enable the impurity regions to control the threshold voltage, the concentration of the impurity element should be at least about 100 times the substrate impurity concentration (in a typical single crystal silicon substrate, about $1 \times 10^{15}$ atoms/cm$^3$). Therefore, the lower limit of the concentration is set at $1 \times 10^{17}$ atoms/cm$^3$. Further, a concentration higher than $1 \times 10^{20}$ atoms/cm$^3$ is not preferable because of an increased load on a device.

The added impurity element causes formation of high energy barriers. For example, when boron (B) which an impurity element for imparting p-type conductivity is added to an n-channel FET, an energy band of a channel forming region shown in FIG. 6A is changed to one shown in FIG. 6B in which a barrier $\Delta E$ (called a diffusion potential difference or a built-in potential difference) is formed as a result of a shift of the Fermi level (Ef). The built-in potential difference shown in FIG. 6B serves as an energy barrier that obstructs movement of electrons, i.e., majority carriers of the n-channel FET.

Naturally, the shift of the Fermi level results in a shift of the energy band in the channel forming region. The impurity regions which are the feature of the invention have a conductivity type opposite to that of the other regions; although having low conductivity, they can sufficiently serve as energy barriers.

Similarly, when phosphorus (P) or arsenic (As) which is an impurity element for imparting p-type conductivity is added to a p-channel FET, an energy band of a channel forming region shown in FIG. 6C is changed to one shown in FIG. 6D. The built-in potential difference shown in FIG. 6D serves as an energy barrier that obstructs movement of holes, i.e., majority carriers of the p-channel FET.

In the invention, the fact that the "carrier movement regions" are intrinsic or substantially intrinsic is an important feature characteristic of a semiconductor device having a SOI structure. In this specification, the term "intrinsic region" means a region not containing any impurity elements such as a single crystal silicon layer epitaxially grown on a sapphire substrate, or a region to which neither an impurity element for imparting n-type or p-type conductivity nor an impurity element such as carbon, nitrogen, or oxygen is added intentionally.

The term "substantially intrinsic region" means a region in a crystalline semiconductor (typically single crystal silicon in this specification) in which region a conductivity type that occurs even without intentionally adding any impurity elements for imparting n-type or p-type conductivity is canceled out, or a region which exhibits the same conductivity type as the source and drain regions to such an extent that threshold voltage control is possible.

As for the substantially intrinsic region, in the vicinity of the surface of a crystalline semiconductor (crystalline silicon) the concentration of an impurity element (phosphorus or boron) for imparting one type of conductivity is less than $5 \times 10^{15}$ atoms/cm$^3$ (preferably less than $5 \times 10^{14}$ atoms/cm$^3$) and the oxygen concentration is less than $2 \times 10^{18}$ atoms/cm$^3$ (preferably less than $1 \times 10^{17}$ atoms/cm$^3$).

The term "in the vicinity of the surface of a crystalline semiconductor" means a region capable of functioning as part of a device, and is a single crystal layer of a SOI substrate or a region including at least a carrier moving region (inversion layer), for instance. Since naturally the impurity regions which are the feature of the invention contain a large number of impurity elements, as a matter of course the concentration thereof do not fall within the above-mentioned range.

In this specification, single crystal silicon is used as a typical example of a crystalline semiconductor. The term "single crystal silicon" covers not only single crystal silicon that is commonly used in current manufacture of ICs and LSIs but also single crystal silicon of a higher level (in an extreme case, an ideal one as manufactured in the outer space).

The SOI structure is generally classified into two structures: one structure in which a single crystal silicon layer is grown on an insulative substrate, as typified by a SOS substrate; and the other structure in which an insulating layer is formed in a single crystal silicon substrate, as typified by a SIMOX substrate and a wafer bonding SOI structure. In particular, the SIMOX substrate is the mainstream of the SOI structure after the year 1986.

The invention is applicable to all types of SOI substrates irrespective of their manufacturing methods. That is, in manufacturing a semiconductor device according to the invention, a manufacturer can determine, as desired, how to manufacture an SOI substrate or obtain a single crystal silicon layer.

BRIEF DESCRIPTION OF THE DRAWINGS

FIGS. 1A–1C show the structure of a channel forming region of an IG-FET according to the present invention;

FIGS. 2A and 2B illustrate the operation of the IG-FET of FIGS. 1A–1C;

FIGS. 21A–21D show examples of semiconductor devices to which the invention is applied (ninth embodiment)

DETAILED DESCRIPTION OF THE PREFERRED EMBODIMENTS

Figure 3:
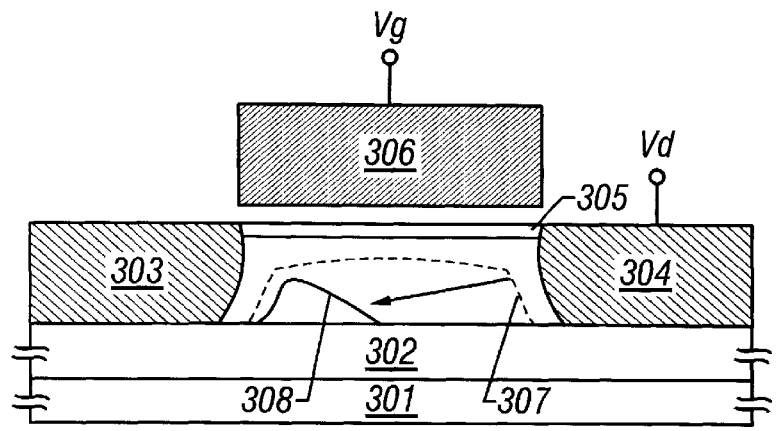
FIG. 3 shows how the short channel effects occur in a conventional semiconductor device.

With reference to FIGS. 1A–1C, a description will be made of a case where the present invention is applied to an n-channel semiconductor device on a SIMOX substrate.

FIG. 1A is a schematic top view of a source region 101, a drain region 102, and a channel forming region 103 of an IG-FET according to the invention.

The invention is characterized in that impurity regions 104 are formed artificially and locally in the channel forming region 103. Although in this example the impurity regions 104 are formed in linear patterns, it is possible to form impurity regions in dot patterns.

It is desirable to form the impurity regions 104 in linear patterns that are generally parallel with the channel direction (i.e., the direction connecting the source and the drain or the carrier movement direction). This is because in such a case the impurity regions 104 serve as side walls to form energy rails that define movement of carriers, so that the probability of occurrence of scattering due to collision between carriers is reduced, resulting in an advantage of an increase in mobility.

The inventors call the carrier moving paths (i.e., the regions between the impurity regions 104) potential slit regions or lane regions.

The following description is directed to a case where the linearly patterned impurity regions 104 are formed generally parallel with the channel direction from one end to the other of the channel forming region 103 (for instance, from the source region 101 to the drain region 102), and boron is employed as an impurity to be added.

As described above, a built-in potential difference that serves as a sufficiently high energy barrier for movement electrons is formed in the impurity regions in which the energy band is shifted by the addition of boron to such a direction that the movement of electrons (majority carriers) is obstructed. Therefore, carriers (in this case, electrons) do not travel through the impurity regions 104.

In particular, it is desirable that the impurity regions 104 be disposed at the junction portion between the drain region 102 and the channel forming region 103 as shown in FIG. 1A, because the electric field varies the most there. Where an electric field generated by the gate voltage encompasses the drain region 102, it is preferred that the impurity regions 104 be formed so as to extend to the inside of the drain region 102. Conversely, it is preferred that the impurity regions 104 be formed so as not to extend to the inside of the source region 101.

The invention is very effective in forming a very small element that requires microprocessing in a deep submicron range of less than 0.35 $\mu$m (particularly less than 0.1 $\mu$m) or even less then 0.01 $\mu$m. Since the length of the channel forming region (channel length or source-drain distance) is as short as 0.01–0.35 $\mu$m, the impurity regions should be patterned to have even smaller dimensions.

For example, where a resist mask is used to form impurity regions in linear patterns, ordinary exposing methods cannot be used to pattern a resist mask, i.e., form openings in a resist film because of their insufficient resolution. In such a case, fine patterns in a deep submicron range may be realized by an exposing method using an excimer laser of KrF, ArF, or the like, an electron beam drawing method, a FIB (focused ion beam) method, or the like.

Since the impurity regions are arranged artificially by patterning, they can be arranged not only in the manner shown in FIG. 1A but also in other various, arbitrary manners.

Next, a description will be made of how the short channel effects can be suppressed when the insulated-gate semiconductor device (IG-FET) having the structure of FIG. 1A which includes the source region 101, the channel forming region 103, and the drain region 102.

FIG. 1B is a sectional view taken along line I–I' in FIG. 1A Reference numerals 105 and 106 denote a silicon substrate and a buried oxide film, respectively. Since the impurity regions 104 are formed so as to connect the source region 101 and the drain region 102, the impurity regions 104 assume an I–I' cross-section shown in FIG. 1B.

FIG. 1C is a cross-section taken along line II–II' in FIG. 1A, in which the channel forming region 103 is cut perpendicularly to the channel direction.

The width of an n-th impurity region 104 in the channel forming region 103 is represented by $W_{pi, n}$ and the interval between adjacent impurity regions (i.e., the width of an m-th potential slit region (carrier movement path) in the channel forming region 103) is represented by $W_{pa, m}$.

The above description is merely directed to the structure, and the operation of the IG-FET will be described below. FIG. 2A is a schematic drawing in which attention is paid to only the channel forming region 103 of the IG-FET.

When a gate voltage and a drain voltage are applied to the semiconductor device having the structure of FIG. 1B, a source-side depletion layer 201, a channel-side depletion layer 202, and a drain-side depletion layer 203 are formed as shown in FIG. 2A. That is, the drain-side depletion layer 203 is prevented from being extending toward the source side due to the existence of the impurity region 204 serving as barriers. Reference numeral 205 denotes part of the buried oxide film.

Although it is difficult to understand the arrangement of the impurity regions 204 from FIG. 1B, they are arranged as shown in FIG. 1A, or as shown in FIG. 1C when viewed along the channel direction. Therefore, it would be easier to understand if a model is used in which the expansion of the drain-side depletion layer 203 is suppressed by a grid-like filter that blocks the channel forming region 103.

Thus, in the semiconductor device having the structure of the invention, the depletion layers are separated from each other and do not interfere with each other as shown in FIG. 2A. Since the source-side depletion layer 201 and the channel-side depletion layer 202 are distributed without being influenced by the drain-side depletion layer 203, an energy state as shown in FIG. 2B is established.

Figure 4:
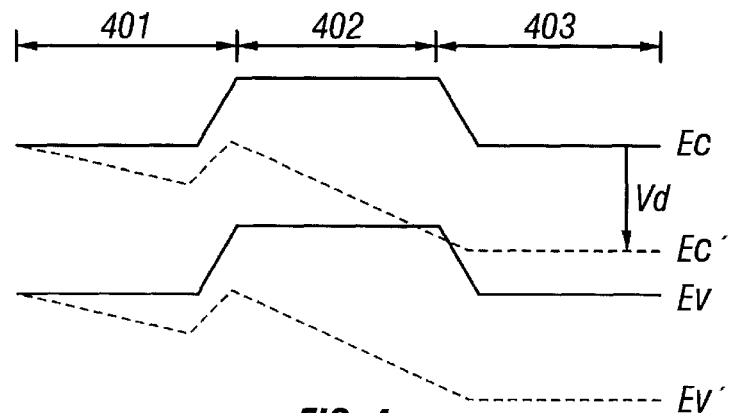
FIG. 4 is an energy band diagram in and around a channel forming region in the short channel effect.

That is, in contrast to the conventional energy state shown in FIG. 4, the energy state of the channel region is controlled almost only by the electric field generated by the gate voltage, the channel-side depletion layer 202 becomes generally parallel with the channel region. Therefore, there do not occur such problems as caused by the short channel effects, for instance, the punch-through phenomenon, and it becomes possible to manufacture semiconductor devices having high drain breakdown voltages.

Further, in the invention, as shown in FIG. 2A, the volume of the depletion layer is smaller than in the conventional case shown in FIG. 3 even with a high drain voltage. Therefore, the invention has a feature that the depletion layer charge and hence the depletion layer capacitance are smaller than in the conventional case.

The S-value is given by a following equation.

$$S = d(Vg)/d(\log Id). \quad (1)$$

Figure 5:
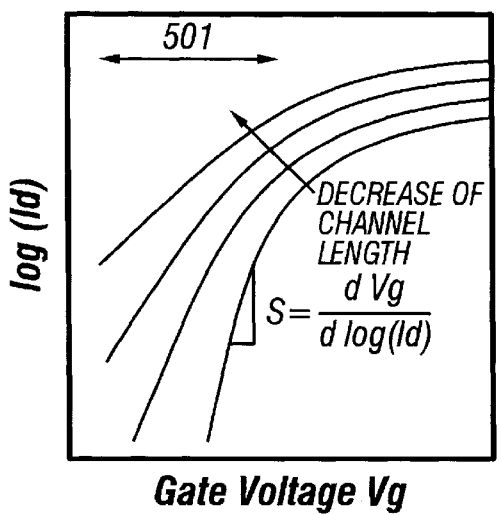
FIG. 5 shows a subthreshold characteristic of a conventional semiconductor device.
Figure 6A:
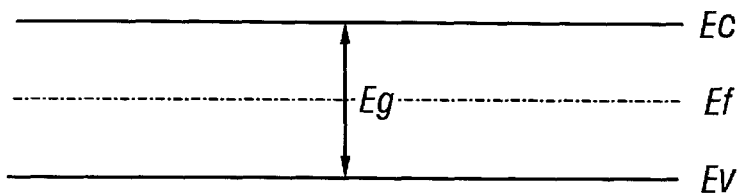
FIGS. 6A–6D are energy band diagrams of a channel forming region.
Figure 6B:
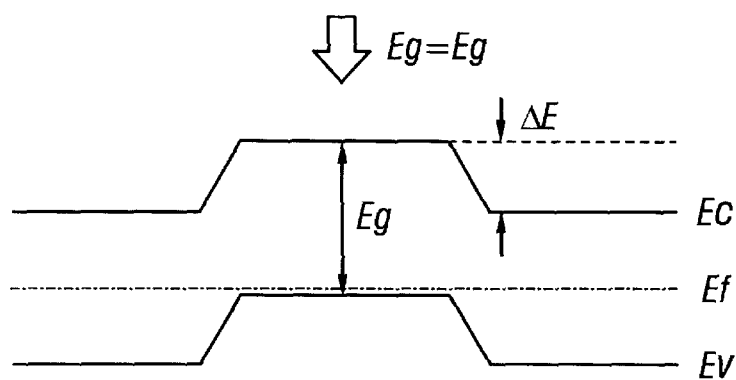
Figure 6C:
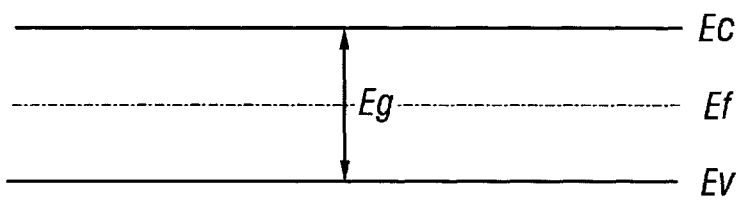
Figure 6D:
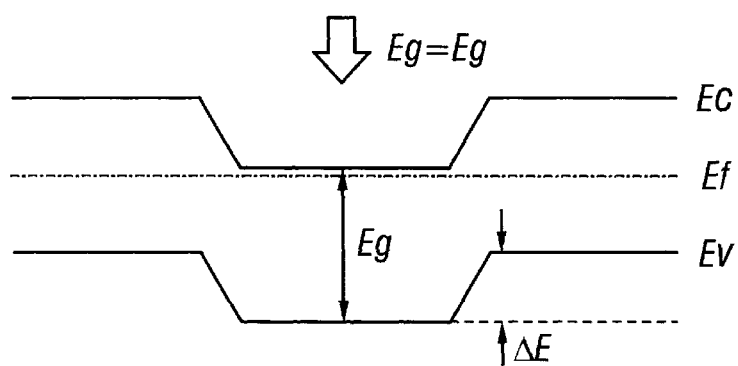

It is seen that, as described above, the S-value represents the reciprocal of the slope in range 501 in the graph of FIG. 5. The above equation is approximated as $$S \approx \ln 10 \cdot (kT/q)\{1 + (Cd + Cit)/Cox\} \quad (2)$$

where k is the Boltzmann constant, T is the absolute temperature, q is the magnitude of electronic charge, Cd is the depletion layer capacitance, Cit is the equivalent capacitance of interface states, and Cox is the gate oxide film capacitance. In the invention, since the depletion layer capacitance Cd is sufficiently smaller than in the conventional case, the S-value can be made as small as less than 85 mV/decade (preferably less than 70 mV/decade), to provide a superior subthreshold characteristic.

The invention aims to make the depletion layer capacitance Cd and the equivalent capacitance of interface states Cit as close to 0 as possible, that is, to make the S-value as close to the value (60 mV/decade) of the ideal state (Cd=Cit=0) as possible.

Further, the fact that the channel forming region has the structure shown in FIG. 1C is very important in reducing the decrease in threshold voltage (short channel effect), because the structure of FIG. 1C is necessary to produce the narrow channel effect intentionally.

The narrow channel effect, which was originally observed in a MOSFET formed on bulk silicon, is a phenomenon in which the threshold voltage increases being influenced by a bird's beak of a device isolation field oxide film, impurity diffusion from a channel stopper, and other factors when the channel width is narrowed.

One of the important concepts of the invention is to intentionally cause the narrow channel effect by artificially forming and arranging the impurity regions in the channel forming region. According to this concept, the threshold voltage is controlled by precisely controlling the distance between adjacent impurity regions ($W_{pa, m}$ in FIG. 1C) in a range of 30–3,000 Å (preferably 30–1,000 Å).

For example, when attention is paid to a certain cross-section as in the case of FIG. 1C, the channel width W is divided by the impurity regions 104, so that the channel forming region can substantially be regarded as a collection of a plurality of channel forming regions having a narrow channel width $W_{pa, m}$.

It is considered that the narrow channel effect is obtained in each of the plurality of regions having a narrow channel width $W_{pa, m}$. Macroscopically, the regions that exhibit the narrow channel effect exist over the entire channel forming region as shown in FIG. 1A. It is therefore considered that the entire channel forming region also exhibits the narrow channel effect and hence the threshold voltage is increased.

Therefore, threshold voltage control can be effected such that an increase in threshold voltage due to the above-described narrow channel effect compensates for a decrease in threshold voltage (short channel effect) caused by shortening of the channel length. As a result, a variation in threshold voltage can be reduced.

The invention as summarized above will be described in detail in the following embodiments. The following embodiments are merely examples of the invention, and can be modified in various manners in accordance with the needs of semiconductor device manufacturers.

Therefore, the claims should cover any changes and modifications of the following embodiments as long as they are made without departing from the spirit and scope of the invention.

Embodiment 1

In this embodiment, with reference to FIGS. 7A through 12B, a description will be made of a case where insulated-gate field-effect transistors, more specifically, a CMOS circuit as a complementary combination of n-channel and p-channel FETs, are formed on a SIMOX substrate by using the invention.

First, a single crystal silicon substrate 701 having weak n-type or p-type conductivity is prepared. A buried oxide film 702 is formed by implanting oxygen ions at a dose of $1\times10^{18}$ atoms/cm$^2$ and then performing a heat treatment in a temperature range of 800°–1,300° C. Thus, a buried oxide film 702 of 0.05–0.5 μm in thickness and a single crystal silicon layer 703 of 100–2,000 Å in thickness (preferably 200–600 Å) are obtained.

As one of the most remarkable features of the SOI technology, the single crystal silicon layer 703 has almost no, i.e., only one to several, impurity elements (already contained in the mother substrate 701), and is therefore extremely pure and intrinsic or substantially intrinsic.

Naturally the thicknesses of the buried oxide film 702 and the single crystal silicon layer 703 are not limited to the ranges of this embodiment, and may be adjusted properly when necessary. For a detailed description of the SIMOX substrate, reference is made to, for instance, Fumio Shimura, "Semiconductor Silicon Crystallographic Engineering," published by Maruzen Co., Ltd. on Sep. 30, 1993, pp. 217 onward.

Figure 7A:
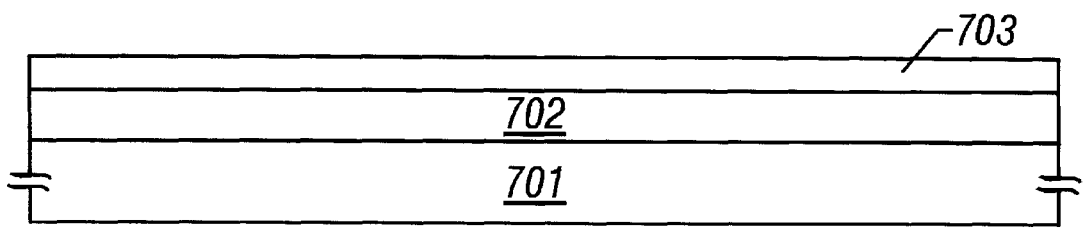
FIGS. 7A–7D and 8A–8C show a manufacturing process of an IG-FET according to a first embodiment of the invention.

Thus, a SIMOX substrate is obtained as shown in FIG. 7A. Naturally other types of SOI substrates may be used such as an SOI substrate formed by using the wafer bonding technique, an SOS substrate formed by growing a single crystal silicon layer on an insulative substrate such as a sapphire substrate, and a FIPOS (full isolation by porous oxidized silicon) substrate formed by utilizing oxidation of porous silicon.

In the state of FIG. 7A, a thin thermal oxidation film (not shown) is formed by subjecting the substrate to a thermal oxidation treatment, and mask patterns 704 and 705 of silicon nitride films are formed thereon. The mask patterns 704 and 705 are placed on regions where n-channel and p-channel FETs are to be formed, respectively.

Then, a device isolation field oxide film 706 is formed by performing thermal oxidation at a high temperature of 1,000–1,200° C., to obtain regions 707 and 708 to become active layers of the n-channel and p-channel FETs, respectively.

Figure 7B:
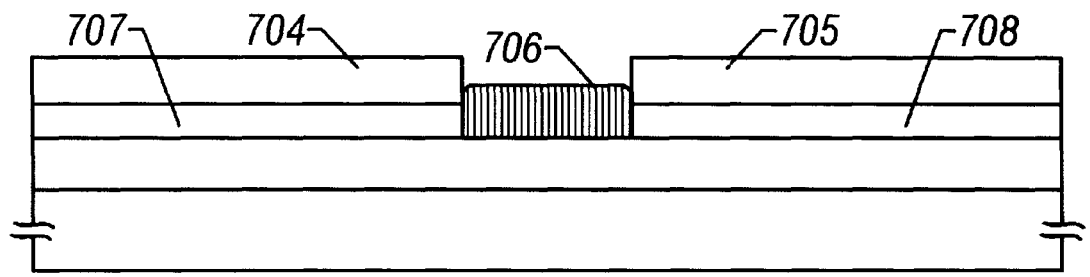

In the state of FIG. 7B, the mask patterns 704 and 705 and the thermal oxidation film (not shown) are removed. A source region 709 and a drain region 710 of the n-channel FET are formed by adding P (phosphorus), and then a source region 711 and a drain region 712 of the p-channel FET are formed by adding B (boron).

The regions for phosphorus implantation and those for boron implantation may be determined by using resist masks. The regions to which no impurity has been added remain intrinsic or substantially intrinsic and constitute channel forming regions 713 and 714 of the n-channel and p-channel FEls, respectively (see FIG. 7C).

Where the channel forming region is an intrinsic or substantially intrinsic region as in the above case, the active layer of a semiconductor device, say, an n-channel FET, has a configuration of n$^+$ (source region)/i (channel forming region)/n+ (drain region), where n$^+$ means strong n-type conductivity and i means intrinsic or substantially intrinsic.

Example of other possible configurations are n$^+$ (source region)/n$^{--}$ (channel forming region)/n$^+$ (drain region) and p$^+$ (source region)/p$^{--}$ (channel forming region)/p$^+$(drain region), where n$^{--}$ means very weak n-type conductivity and p$^{--}$ means very weak p-type conductivity.

Conventionally, the above configuration has a problem of a reduction in breakdown voltage though it has an advantage of an increased mobility. According to the invention, which enables formation of a semiconductor device having a high breakdown voltage, requirements of a high mobility and a high breakdown voltage can be satisfied at the same time.

Figure 7C:
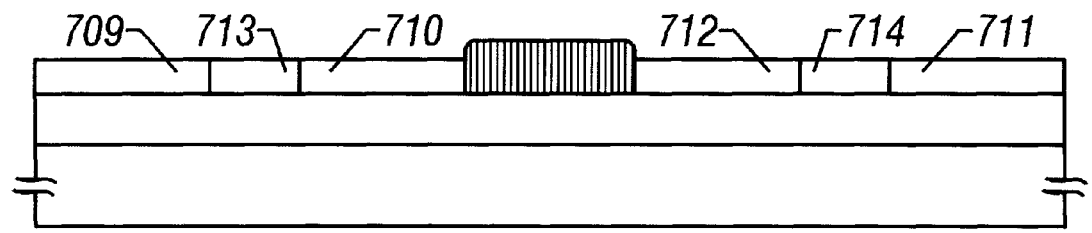
Figure 7D:
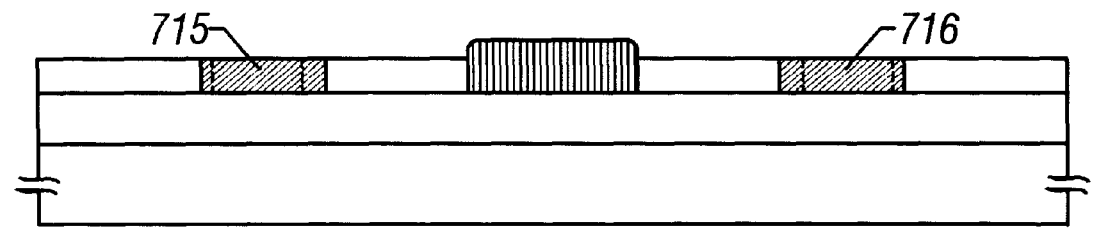

In the state of FIG. 7C, boron (B) is added to the channel forming region 713 of the n-channel FET and phosphorus (P) or arsenic (As) is added to the channel forming region 714 of the p-channel FET, to form impurity regions 715 and 716 as depletion layer stoppers (see FIG. 7D). In this embodiment, oxygen is used as the impurity element, and the regions 715 and 716 to add oxygen are selected by using a resist mask (not shown) obtained by forming openings in a resist film by patterning.

Since the impurity regions 715 and 716 need to be formed at extremely small dimensions, an accurate lithography technique is required for that purpose. To this end, exposure may be performed in linear patterns by a technique using an electron beam (electron beam drawing method), a technique using an ion beam (FIB method), a technique using an excimer laser, or a like technique. To form the fine impurity regions 715 and 716 with high accuracy, it is preferred to add the impurity element by an ion implantation method.

It is preferred to activate the impurity element that is added to the impurity regions 715 and 716 by furnace annealing, laser annealing, lamp annealing, or the like. Care should be taken so as to minimize the thermal diffusion. For example, if furnace annealing is conducted at about 500–800° C. (preferably 600–700° C.), sufficient activation can be effected while thermal diffusion of the impurity element is suppressed.

Alternatively, the impurity element may be activated at the same time as its implantation by heating the substrate during the ion implantation. The impurity element activation efficiency at the time of the ion implantation is improved by increasing the RF power of the ion implantation. The impurity element may be activated either by one of the above-mentioned annealing processes or by a combination of those.

In forming the impurity regions 715 and 716, the width $W_{pa, m}$ of each potential slit region is controlled so as to fall within a range of 30–3,000Å (preferably 30–1,000 Å). All the widths $W_{pa, m}$ are controlled so as to fall within a variation range of ±20% (preferably ±5%). It is important to precisely control the widths $W_{pa, m}$ of the potential slit regions because they directly influence the narrow channel effect.

The lower limit width 30Å of the potential slit regions is determined as a limit value above which no quantum effect occurs. In the invention, care should be taken so that the widths of the potential slit regions are controlled so as to fall within the range where no quantum effect occurs.

Thus, the impurity regions 715 and 716, which are arranged as shown in the top view of FIG. 1A, are formed so as to equalize the widths $W_{pa, m}$ of all the potential slit regions. As a result, it becomes possible to effectively suppress a variation in threshold voltage (caused by a variation in narrow channel effect) and a variation in heat generation (caused by a variation in the density of current flowing through the potential slit regions).

To increase the breakdown voltage of the semiconductor device, it is effective to form the impurity regions 715 and 716 so that they go into the drain regions 710 and 712, respectively, as shown in FIG. 7D. Although the impurity regions 715 and 716 may either go into the source regions 709 and 711 or does not, it is preferred that they not go into the source regions 709 and 711. (To clarify the boundary of the channel forming regions 713 and 714, in this embodiment the impurity regions 715 and 716 also go into the source regions 709 and 711.)

Where LDD regions are provided between the channel forming region 713 or 714 and the source and drain regions 709 and 710 or 711 and 712, it is preferred that the impurity regions 715 or 716 be formed so as to go into the LDD region or go into the drain region 710 or 712 past the LDD region. The above configurations are effective in increasing the breakdown voltage of the semiconductor device.

In the state of FIG. 7D, a thermal oxidation treatment is performed in a temperature range of 800–1,200° C. to form thermal oxidation films 717 and 718 of 100–500Å in thickness, which serve as gate insulating films as they are. Each active layer/gate insulating film interface has good quality with a small number of interface states.

It is preferred that the above thermal oxidation treatment be conducted in a halogen atmosphere. In such a case, heavy metals such as Ni (nickel) and Cu (copper) that segregate at the interfaces between the impurity regions 715 and 716 and the potential slit regions can be removed by gettering.

The above heavy metals are ones that are left inside in not a small amount, for instance, in the process of forming single crystal silicon, and act as carrier recombination centers to possibly lower the mobility. By conducting the thermal oxidation treatment in a halogen atmosphere, it is expected that a halogen element (for instance, chlorine or fluorine) exhibits a gettering effect on the metal elements.

Figure 8A:
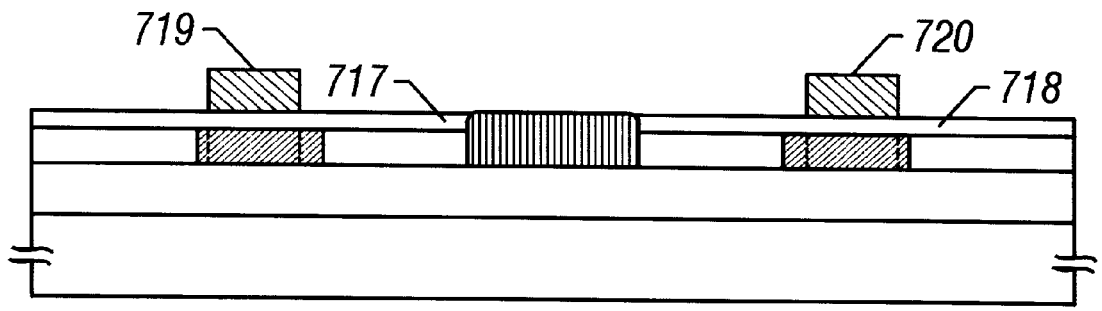

Polysilicon films 719 and 720 as gate electrodes are further formed on the thermal oxidation films 717 and 718 over the channel forming regions 713 and 714, respectively. The gate electrodes 719 and 720 may be rendered conductive by adding an impurity element during their formation. Thus, the state of FIG. 8A is obtained.

Figure 8B:
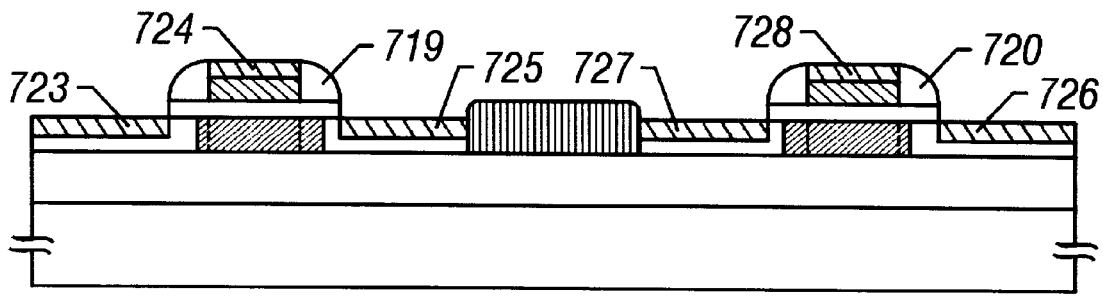

Then, as shown in FIG. 8B, a 3,000-Å-thick silicon nitride film is formed so as to cover the gate electrodes 719 and 720, and then etched back to leave sidewalls 721 and 722 only on the side faces of the gate electrodes 719 and 720. Part of the gate insulating films 717 and 718 that are located on the source regions 709 and 711 and the drain regions 710 and 712 are removed at the same time.

In this state, a titanium film (not shown) is formed over the entire surface by sputtering, and then silicified by heating, laser annealing, or lamp annealing. As a result, titanium silicide layers 723–725 are formed on the surfaces of the source region 709, drain region 710, and gate electrode 719 of the n-channel FET and titanium silicide layers 726–728 are formed on the surfaces of the source region 711, drain region 712, and gate electrode 720 of the p-channel FET (see FIG. 8B).

The formation of the titanium silicide layers 713–728 is favorable for taking ohmic contact to later formed interconnections because the titanium silicide layers 713–728 have extremely low resistivity.

In this state, a silicon nitride film 729 is formed as an interlayer insulating film. After contact holes are formed through the silicon nitride film 729, source electrodes 730 and 731 for the n-channel and p-channel FETs, respectively, and a drain electrode 732 for both n-channel and p-channel FETs are formed. Thus, CMOS IG-FETs are completed as shown in FIG. 8C.

Figure 8C:
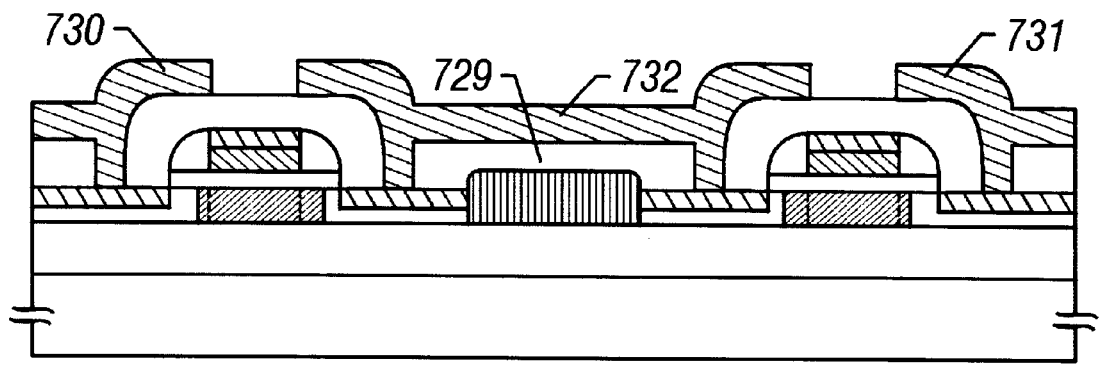

Capable of being miniaturized without causing any problems of the short channel effects by virtue of the invention, the CMOS circuit having the structure of FIG. 8C can provide integrated circuits of an extremely high degree of integration.

Although the embodiment is directed to a single gate IG-FET, the invention can also be applied to a case of manufacturing a double gate FET having channels on both top and bottom surface sides of an active layer because of the SOI structure. It goes without saying that the invention can also be applied to a power MOSFET, a MESFET, a MISFET, etc.

This embodiment is characterized in that the impurity regions are formed in linear patterns in the channel forming region of an IG-FET. Certain conditions (in ranges of parameters) need to be satisfied in forming the linear patterns, as described below with reference to FIGS. 9A and 9B.

Figure 9A:
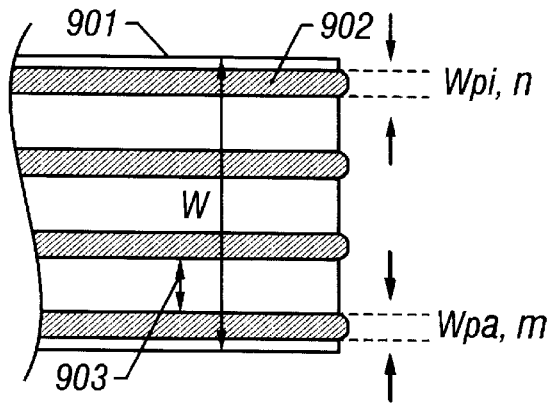
FIGS. 9A–9C illustrate a shape and an arrangement of the impurity regions according to a first embodiment of the invention.
Figure 9B:
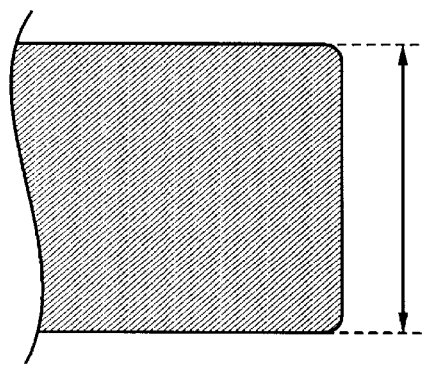
Figure 9C:
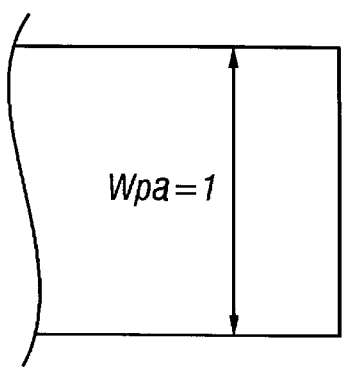

In FIGS. 9A and 9B, reference numeral 901 denotes part of a channel forming region. Of a channel width W, the total width of linear patterns 902 is represented by $W_{pi}$. It suffices that the total width $W_{pi}$ be 10–100 Å, for instance. Let the widths of the respective linear patterns 902 be represented by $W_{pi,\ 1}, W_{pi,\ 2}, \ldots, W_{pi,\ n}, \ldots, W_{pi,\ N}$, then $W_{pi}$ is given by $$Wpi = \sum_{n=1}^{N} Wpi, n$$

Since to realize the invention at least one impurity region needs to be formed at a position excluding both side ends of the channel forming region, N is an integer greater than or equal to 1.

Of the channel width W, the total width of potential slit regions (carrier movement paths) 903 is represented by $W_{pa}$, which is set in a range where the quantum effect does not appear, that is, 30–3,000Å (preferably 30–1,000 Å). According to the invention, threshold voltages $V_{th,\ n}$ and $V_{th,\ p}$ can be adjusted so as to fall within a range of 0 to ±0.3 V by making $W_{pa}$ about 1/3 to 1/1 of the channel length (0.01–0.35 μm). Let the widths of the respective linear patterns 902 be represented by $W_{pa,\ 1}, W_{pa,\ 2}, \ldots, W_{pa,\ m}, \ldots, W_{pa,\ M}$; then $W_{pa}$ is given by $$Wpa = \sum_{m=1}^{M} Wpa, m$$

Since as mentioned above at least one impurity region needs to be formed at a position other than both sides of the channel forming region, M is an integer greater than or equal to 2.

Thus, relationships the channel width $W = W_{pi} + W_{pa}$ and $N + M \geq 3$ hold. It is desirable that the following conditions be satisfied simultaneously with respect to relationships between W and $W_{pi}$, between W and $W_{pa}$, and $W_{pi}$ and $W_{pa}$:

$W_{pi}/W = 0.1$ to $0.9$ $W_{pa}/W = 0.1$ to $0.9$ $W_{pi}/W_{pa} = 1/9$ to $9$

The above equations mean that $W_{pa}/W$ and $W_{pi}/W$ should not be 0 or 1. For example, if $W_{pa}/W = 0$ (i.e., $W_{pi}/W = 1$), the channel forming region is completely filled with the impurity region as shown in FIG. 9B and hence there is no current flowing path.

Conversely, if $W_{pa}/W=1$ (i.e., $W_{pi}/W=0$), there exists no impurity region in the channel forming region and hence the expansion of the drain-side depletion layer cannot be suppressed.

For the above reasons, it is desirable that $W_{pa}/W$ and $W_{pi}/W$ fall within the range of 0.1–0.9 (preferably 0.2–0.8) and, at the same time, $W_{pi}/W_{pa}=1/9$ to 9 be satisfied.

In the invention, for the reasons described below, arranging the linearly patterned impurity regions as shown in FIG. 1A has an important meaning for increase of the mobility, which is a typical parameter representing the performance of a FET.

The mobility is determined by scattering of carriers in a semiconductor (in this embodiment, a silicon substrate), and scattering in a silicon substrate is generally classified into lattice scattering and impurity scattering. The lattice scattering is dominant when the impurity concentration in a silicon substrate is low and the temperature is relatively high, and the impurity scattering is dominant when the impurity concentration is high and the temperature is relatively low. The total mobility $\mu$, which reflects both factors, is given by $$\mu = (1/\mu_l + 1/\mu_i)^{-1}. \tag{5}$$

The above equation means that the total mobility $\mu$ is in inverse proportion to the sum of reciprocals of mobility $\mu_l$ (suffix "l" is for lattice) that reflects influence of the lattice scattering and mobility $\mu_i$ (suffix "i" is for impurity) that reflects influence of the impurity scattering.

As for the lattice scattering, acoustic phonons play an important role if the drift electric field is not strong and the mobility $\mu_l$ in such a state is in proportion to the $(-3/2)$th power of the temperature as given by Formula (6). Thus, the mobility $\mu_l$ is determined by only the effective mass m* of carriers and the temperature T.

$$\mu_l \, (m^*)^{-5/2} T^{-3/2} \tag{6}$$

On the other hand, the mobility $\mu_i$ which relates to the impurity scattering is in proportion to the $(3/2)$th power of the temperature and in inverse proportion to a concentration Ni of ionized impurities as given by Formula (7), and can be varied by adjusting a concentration Ni of ionized impurities.

$$\mu_i \, (m^*)^{-1/2} Ni^{-3/2} \tag{7}$$

Formulae (6) and (7) indicate that the conventional channel doping of adding an impurity to the entire channel forming region cannot improve the mobility because of the influence of the impurity scattering. In contrast, in the invention, the impurity regions are formed locally and therefore no impurity is added to the potential slit regions whose total width is $W_{pa}$.

Theoretically, the concentration Ni of ionized impurities in Formula (7) is made infinitely close to 0 and hence the mobility $\mu_i$ approaches infinity. In Equation (5), it is meant that the impurity concentration is reduced to such an extent that the term $1/\mu_i$ is disregarded, and hence the total mobility $\mu$ becomes infinitely close to the mobility $\mu_l$.

It is theoretically possible to further increase the mobility $\mu_l$ by decreasing the carrier effective mass m*. This can be done by utilizing the fact that in a very low temperature range the effective mass of carriers (particularly electrons) varies depending on the crystal axis orientation.

According to the literature, the minimum effective mass is obtained when the channel direction (carrier movement direction) connecting the source and the drain is set coincident with the <100> axis direction of single crystal silicon.

Figure 10:
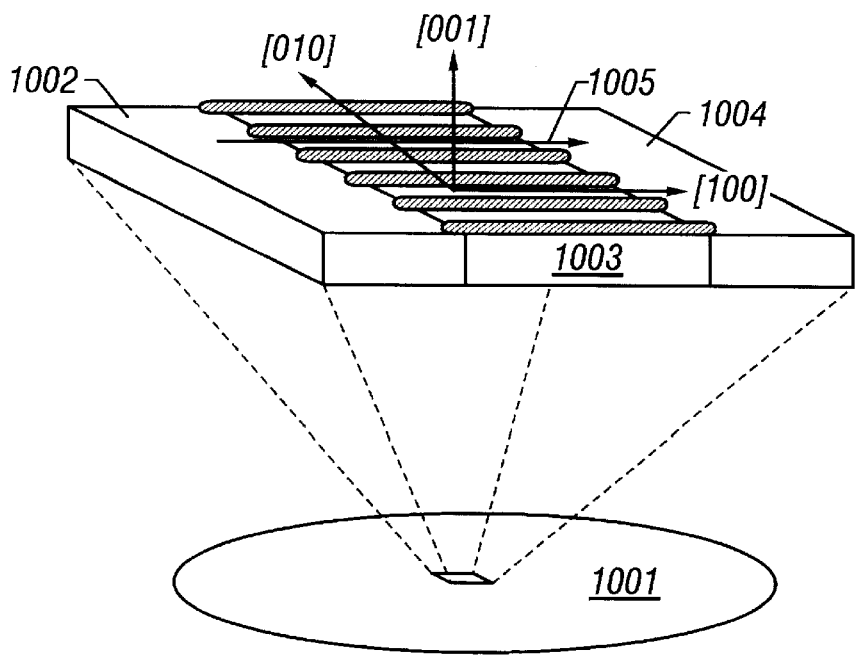
FIG. 10 illustrates a proper orientation of the channel direction according to a first embodiment of the invention.

For example, assume that a source region 1002, a channel forming region 1003, and a drain region 1004 are formed on a single crystal silicon substrate 1001 having the (100) plane as shown in FIG. 10. The above orientation corresponds to a case where a channel direction 1005 is set coincident with the [100] direction. However, in this example the intended result is obtained at a very low temperature of 4°K.

Further, to allow carriers to "slip through" crystal lattices, it is desirable that the channel direction and the longitudinal axis direction of the impurity regions be generally parallel with the crystal lattice axial direction (the deviation be made within ±10°). In the case of a single crystal where silicon atoms are arranged regularly, carriers moving parallel with a crystal lattice arrangement direction are scarcely influenced by the lattice scattering.

For example, if the rotation axis in the above-mentioned direction is defined as 0° in a single crystal silicon substrate, the same effects can be obtained with other rotation axes of 90°, 180°, and 270°.

As described above, in the channel forming regions carriers go through the regions other than the impurity regions. This will be described briefly with reference to schematic drawings of FIGS. 11A–11C.

Figure 11A:
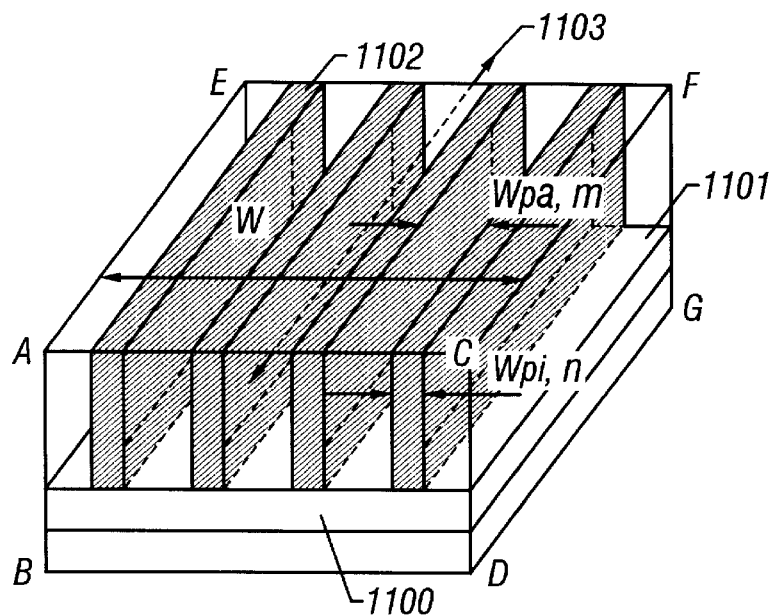
FIGS. 11A–11C shows a configuration of the channel forming region according to a first embodiment of the invention.

In FIG. 11A, reference numeral 1101 denotes a channel forming region. That is, FIG. 11A is a perspective view in which the channel forming region 1101 is viewed from a top right position. In this embodiment, impurity regions 1102 are formed, three-dimensionally, as shown in FIG. 11A.

In FIG. 11A, arrow 1103 indicates a carrier (electrons or holes) traveling direction. As shown in FIG. 11A, a plurality of impurity regions 1102 are arranged in the channel forming region 1101 and carriers go through the regions other than the impurity regions 1102.

Figure 11B:
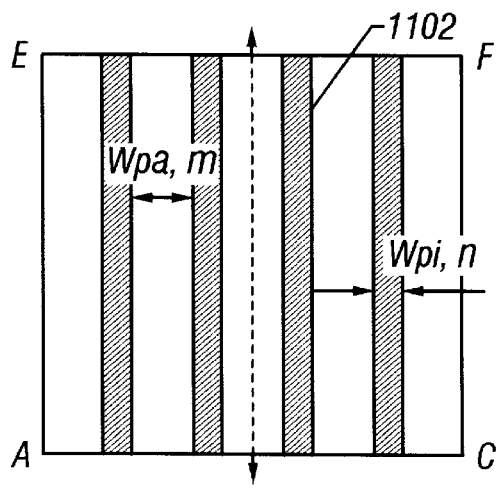

FIG. 11B is a top view of the channel forming region 1101 and shows plane ACEF in FIG. 11A. As shown in FIG. 11B, carriers go through the regions that are free of impurity scattering while avoiding the impurity regions 1102.

Most of carriers move between the source and the drain through the regions between the impurity regions 1102 as indicated by the arrow. The invention naturally includes a case where impurity regions are provided in dot patterns and carriers move in a zigzag so as to avoid the impurity regions.

Figure 11C:
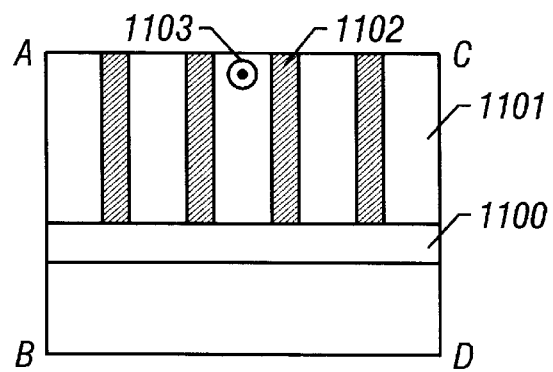

FIG. 11C is a side view of the channel forming region 1101 and shows plane ABCD in FIG. 11A Arrow 1103 is directed to the viewer's side. FIG. 11C also indicates that carriers go through the regions between the impurity regions 1102.

Figure 12A:
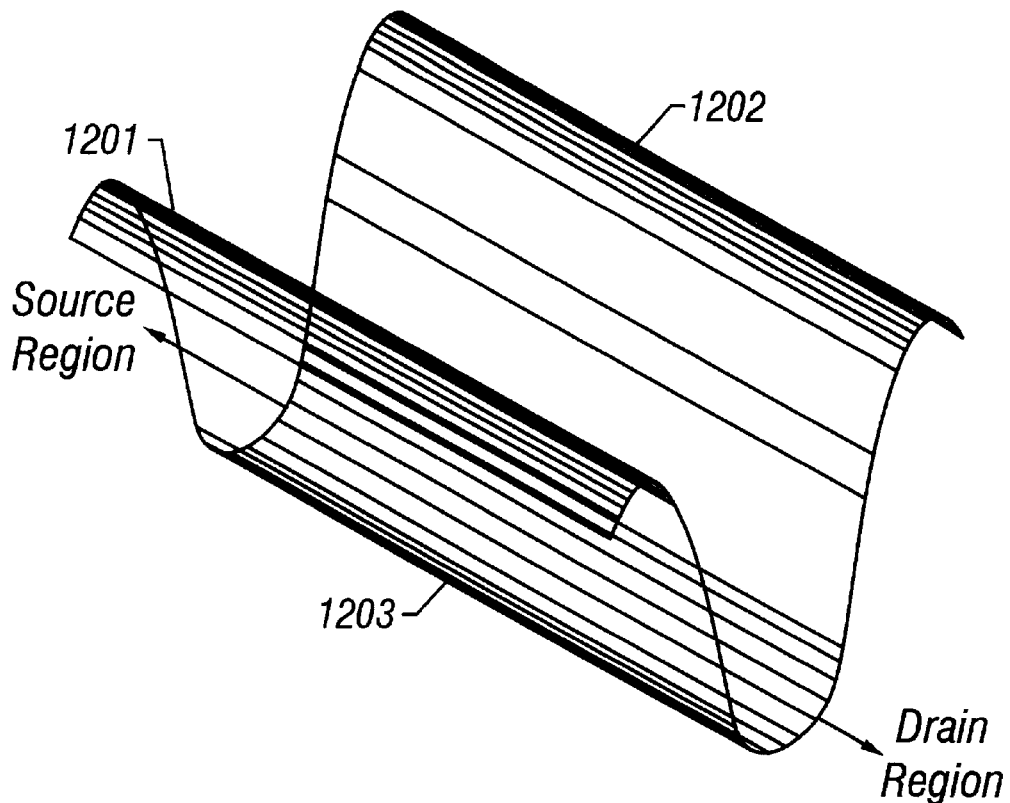
FIGS. 12A and 12B illustrate an energy profile of the channel forming region according to a first embodiment of the invention.

In a potential slit region that is interposed between linearly patterned impurity regions, it is the energy state (potential state) is believed to have a profile as schematically shown in FIG. 12A.

In FIG. 12A, reference numerals 1201 and 1202 denote energy states in impurity regions, which are high energy barriers. As the position goes away from the impurity regions, the energy gradually decreases, and reference numeral 1203 denotes a low energy region. In the channel region, carriers (in this example, electrons) move, with preference, through the low energy region 1203 while the energy barriers (impurity regions) 1201 and 1202 act like walls.

Figure 12B:
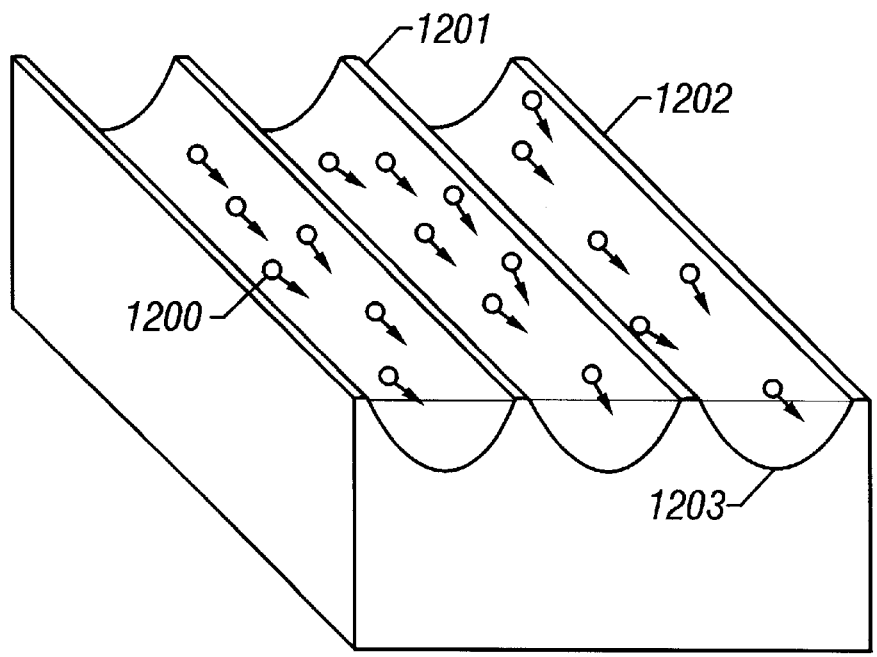

FIG. 12B schematically illustrates carriers (electrons) moving through the channel region. As shown in FIG. 12B, stated in images, the directivity of carriers 1200 moving through the channel regions is defined like that of balls rolling down a trough; carriers 1200 approximately go along the shortest route from the source region to the drain region.

The inventors recognizes the energy profile of FIG. 12A as an electrical slit and call it a potential slit region. The inventors also call it a lane region, imagining balls rolling on a lane based on the model as shown in FIG. 12B.

Although in FIG. 12B the channel forming region consists of a plurality of potential slit regions like the one shown in FIG. 12A are arranged parallel with each other, carriers do not go over the barrier regions 1201 and 1202, that is, there is no carrier movement between adjacent potential slit regions.

For the reasons described above, the probability that a carrier collides with other carriers is very much reduced and hence the mobility is greatly increased. That is, according to the invention, the mobility can be greatly increased not only by reducing the impurity scattering but also by reducing the scattering due to self-collision of carriers.

The concept of the invention is entirely novel in which energy barriers such as grain boundaries, which are conventionally believed to cause only adverse effects, are formed intentionally and utilized.

Embodiment 2

In the invention, impurity regions may be formed in a channel forming region by utilizing segregation of an impurity. In this embodiment, with reference to FIGS. 13A–13B and 14A–14C, a description will be made of an example of such a method, that is, a method which utilizes segregation of boron (B) or phosphorus (P) in the vicinity of a thermal oxidation film.

This embodiment is a technique which utilizes a phenomenon that an impurity element (boron or phosphorus) that is contained around the impurity regions (i.e., in the potential slit regions) segregates in the impurity regions. Now, referring to FIGS. 13A and 13B, a description will be made of a boron or phosphorus concentration profile in the vicinity of a thermal oxidation film/silicon interface after execution of a thermal oxidation process.

Figure 13A:
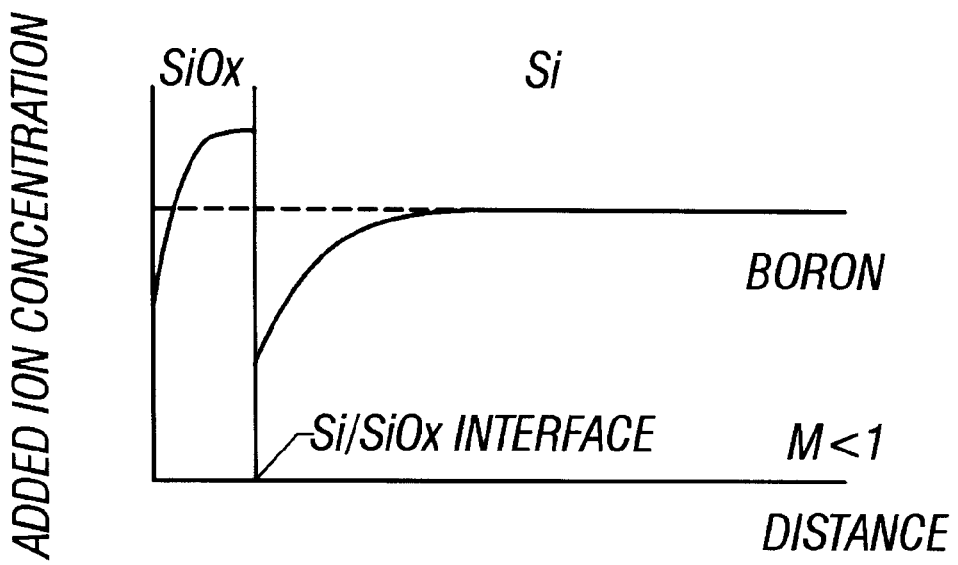
FIGS. 13A and 13B show impurity concentration profiles in the vicinity of a thermal oxidation film/silicon interface according to a second embodiment of the invention.
Figure 13B:
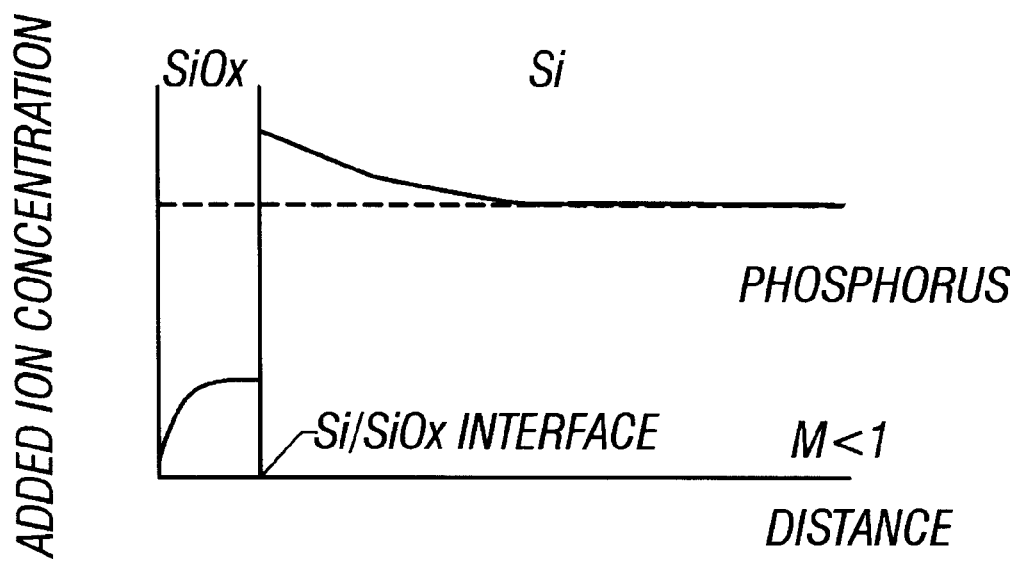

As shown in FIGS. 13A and 13B, added ions (B or P) existing in Si are redistributed when an oxide film is formed. This phenomenon is caused by differences in the solubility and diffusion rate of added ions between silicon (Si) and the thermal oxidation film ($SiO_x$). Let $[C]_{Si}$ and $[C]_{SiOx}$ represent solubilities of an impurity in Si and $SiO_x$, respectively; then, an equilibrium segregation coefficient m is defined as $$m=[C]_{Si}/[C]_{SiOx}.$$

The segregation of the impurity in the vicinity of the $Si/SiO_x$ interface is governed by the value of m. Usually, with an assumption that diffusion coefficient of the impurity in Si is sufficiently large, the impurity in Si is taken into $SiO_x$ if m <1 (see FIG. 13A). If m>1, $SiO_x$ rejects the impurity, so that the impurity concentration increases in the vicinity of the $Si/SiO_x$ interface (see FIG. 13B).

According to the literature, the coefficient m is about 0.3 for boron and about 10 for phosphorus. Therefore, a boron concentration profile after execution of the thermal oxidation treatment of this embodiment, becomes as shown in FIG. 13A. Boron is taken into the thermal oxidation film and the boron concentration is extremely low at the side surfaces (in the vicinity of the $Si/SiO_x$ interfaces) of the impurity regions. On the other hand, the thermal oxidation film formed contain a large amount of boron.

Although the phenomenon that boron is taken into a thermal oxidation film was known, the concept of the invention in which this phenomenon is utilized to form energy barriers (impurity regions) is entirely novel.

Where phosphorus is used as an impurity element, it segregates (piles up) at the interface between a thermal oxidation film and silicon as shown in FIG. 13B. This phenomenon can also be utilized to form impurity regions in a p-channel FET.

Figure 14A:
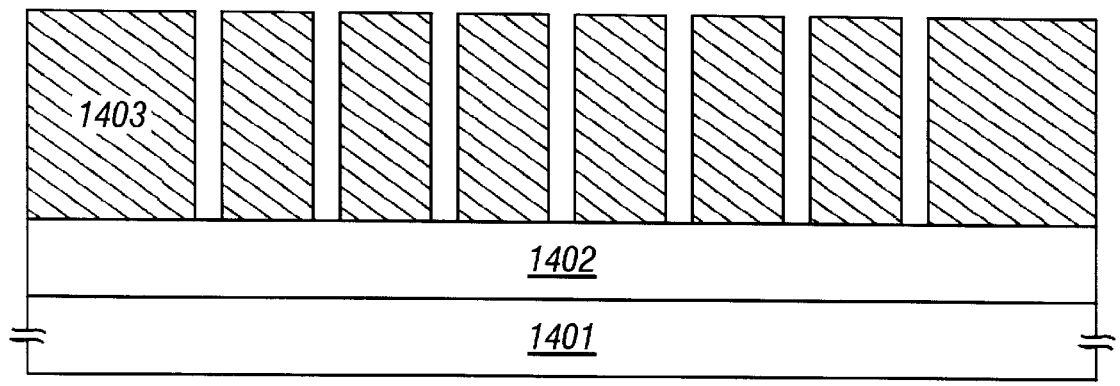
FIGS. 14A–14C show a process of forming impurity regions according to a second embodiment of the invention.

Next, with reference to FIGS. 14A–14C, a description will be made of an example of actual formation of impurity regions. FIG. 14A shows a single crystal silicon layer of a SOI substrate. Reference numerals 1401 and 1402 denote an insulating layer and a single crystal silicon layer, respectively. Examples of the SOI substrate are a SOS substrate, a SIMOX substrate, and a FIPOS substrate.

A resist pattern 1403 for formation of impurity regions is formed on a channel forming region by using a fine lithography technique such as an electron beam method, a FIB method, or an excimer laser method.

Figure 14B:
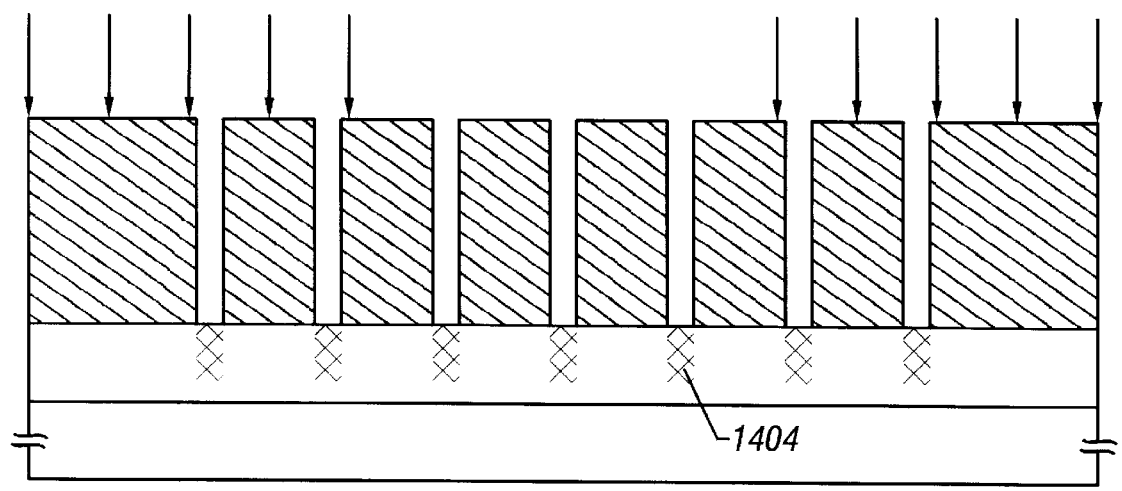

In the state of FIG. 14A, Ar (argon) is implanted by ion implantation (see FIG. 14B). Although Ar is used in this embodiment, other rare gases such as He (helium) and Ne (neon) may also be used.

The above ion implantation is performed by using an electrically inactive element because it aims at damaging the single crystal silicon layer 1402. This is because this embodiment utilizes a tendency that when single crystal silicon is thermally oxidized, damaged regions are oxidized with preference given thereto.

Thus, Ar-added regions 1404 in FIG. 14B are damaged and disordered in crystal arrangement as compared to the other regions.

Figure 14C:
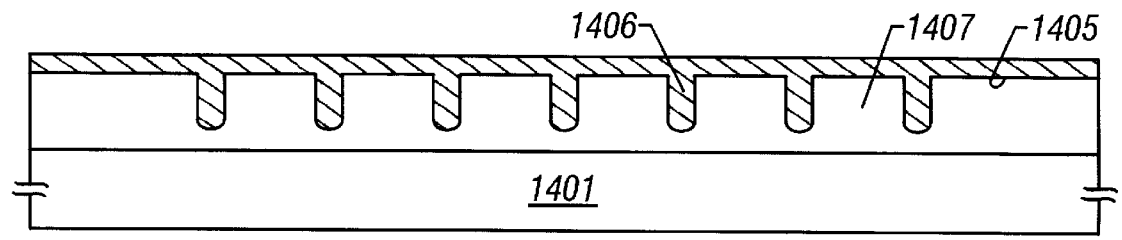

After the resist pattern 1403 is removed, a heat treatment is performed in a temperature range of 800°–1,200° C. as shown in FIG. 14C. In this embodiment, a heat treatment at 1,000° C. is continued for 60 minutes such that an oxidizing atmosphere is used in the first 30 minutes and then switched to a halogen atmosphere including nitrogen ($N_2$; 90%), oxygen ($O_2$; 9%), and hydrogen chloride (HCl; 1%) in the last 30 minutes.

The heat treatment in the first 30 minutes is for thermal oxidation and that in the last 30 minutes is for gettering of metal elements. The reason why the last heat treatment is performed in an atmosphere containing a large amount of nitrogen is to prevent excessive oxidation of the single crystal silicon layer 1402.

Thus, a thermal oxidation film 1405 is formed in the single crystal silicon layer 1402 as shown in FIG. 14C. At the same time, the oxidizing reaction proceeds in the regions 1404 with preference given thereto, so that impurity regions (made of silicon oxide in this case) 1406 are formed so as to go into the single crystal silicon layer 1402. Although in FIG. 14C the impurity regions 1406 do not reach the underlying insulating layer 1401, there may be a case that the impurity regions 1406 are formed so as to reach the insulating layer 1401 by properly adjusting the Ar implantation conditions.

Alternatively, the embodiment may be practiced by damaging the single crystal silicon layer 1402 by directly applying, for instance, an electron beam or a focused ion beam to the single crystal silicon layer 1402.

In the process that the impurity regions 1406 are formed by oxidation in the above manner, an impurity element contained in the adjacent potential slit regions is segregated. Therefore, if an impurity element for imparting one type of conductivity to the channel forming region is added to it, the impurity element segregates in the impurity regions 1406 (in the case of boron) or on the side surfaces of the impurity regions 1406 (in the case of phosphorus). The configuration of the first embodiment of the invention can be obtained by causing boron to segregate in oxide regions to manufacture an n-channel FET and causing phosphorus to segregate on the side surface of oxide regions to manufacture a p-channel FET.

Since this embodiment utilizes both of the metal element gettering effect of a halogen element and the segregation of boron or phosphorus in or on a thermal oxidation film, there exist neither causes of impurity scattering nor impurity elements as recombination centers in the carrier movement regions (particularly in the vicinity of the impurity regions 1406) which are intrinsic or substantially intrinsic.

As described above, this corresponds to increase of $\mu_i$ in Equation (5), in which case the total mobility $\mu$ approaches the ideal case of $\mu=\mu_l$. This indicates that an extremely high mobility can be realized which is determined substantially only by the lattice scattering. Thus, this embodiment enables formation of a semiconductor device having an extremely high mobility.

Embodiment 3

This embodiment is directed to a case of forming dot-patterned impurity regions in a channel forming region. This embodiment will be described with reference to FIGS. 15A–15C in which the same reference numerals as in FIGS. 1A–1C are used for convenience of description.

Figure 15A:
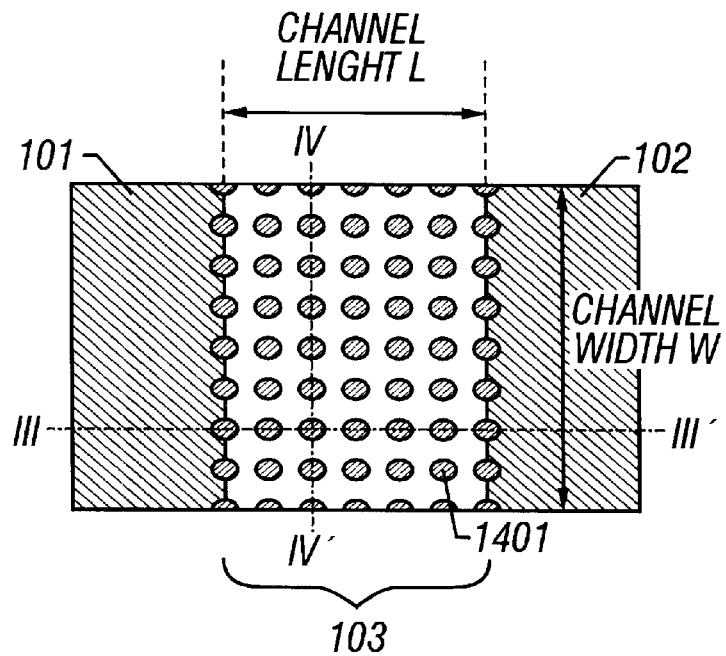
FIGS. 15A–15C show a configuration of a channel forming region according to a third embodiment of the invention.
Figure 15B:
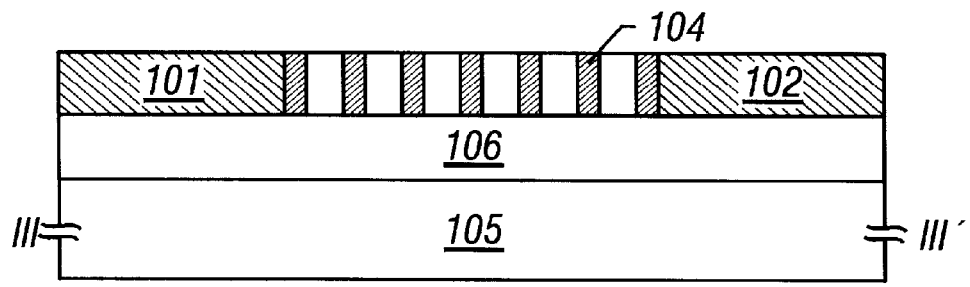
Figure 15C:
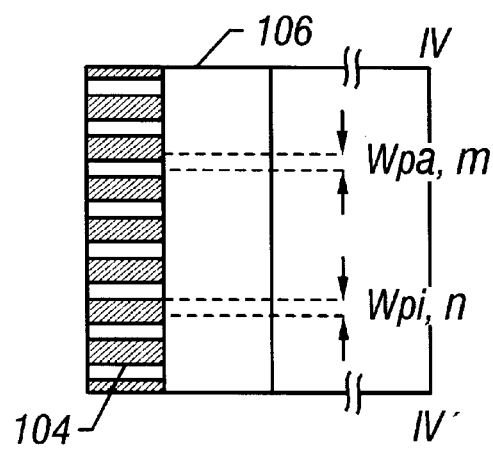

A semiconductor device of FIGS. 15A–15C are configured such that the linearly patterned impurity regions in FIGS. 1A–1C are replaced by dot-patterned ones. That is, impurity regions 1501 are arranged as shown in FIG. 15A.

FIGS. 15B and 15C are sectional views taken along lines III–III ' and IV–IV' in FIG. 15A, respectively.

Although this embodiment employs circular impurity regions as the dot-patterned impurity regions, the dot-patterned impurity may have an elliptical shape, a square shape, a rectangular shape, or the like.

The dot-patterned impurity regions do not provide the role of the lane regions of the first embodiment. However, since the effective channel area (carrier movable area) is larger than in the case of the linearly patterned impurity regions, the dot-patterned impurity regions can increase the amount of current that is allowed to flow through a semiconductor device.

Embodiment 4

In the first and third embodiments, the impurity regions have the simplest forms, i.e., linear patterns and dot patterns, respectively. This embodiment is directed to variations of the shape of the impurity regions.

Figure 16A:
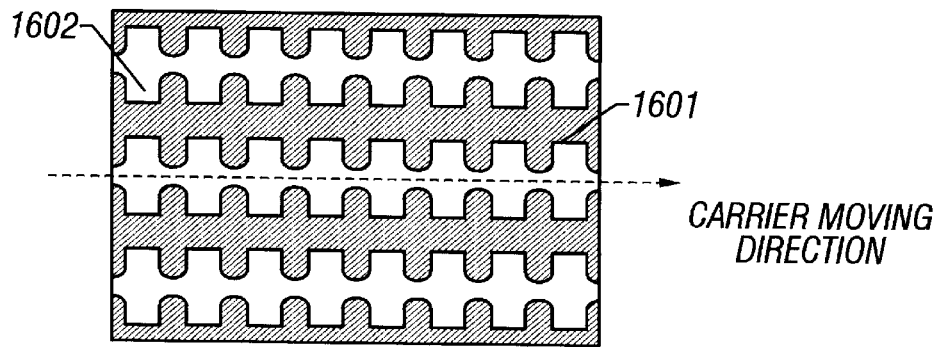
FIGS. 16A–16D show structures of impurity regions according to a fourth embodiment of the invention.

FIG. 16A shows a variation of the linearly patterned impurity regions. In this structure, the first priority is given to prevention of the punch-through phenomenon as one of the short channel effects by enhancing the invention's effect of "pinning" (preventing) expansion of a depletion layer from the drain region side to the channel forming region side.

As seen from FIG. 16A, impurity regions 1601 is characterized in that the side surfaces of linearly patterned impurity regions are formed with protrusions and recesses 1602 when viewed from above, to assume what is called a fishbone shape. The protrusions and recesses 1602 on the side surfaces effectively prevent expansion of the depletion layer.

Figure 16B:
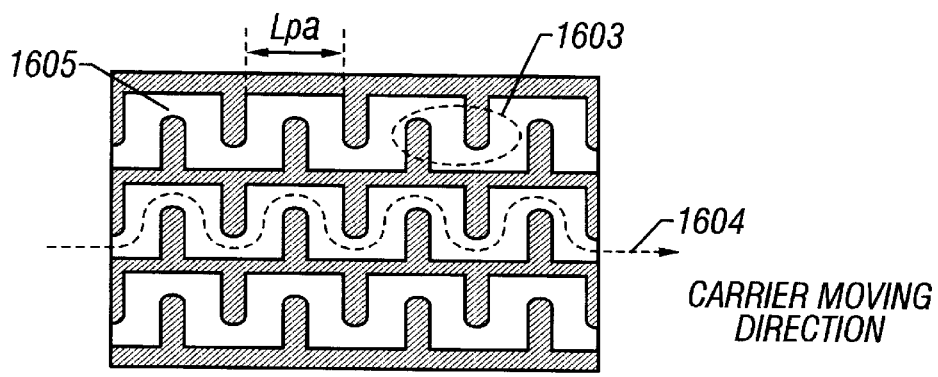

FIG. 16B shows a structure as an advanced version of the structure of FIG. 16A, which further enhances the pinning effect. Because of fishbone shapes conforming to each other, the impurity regions are opposed to a depletion layer in a larger area, whereby the expansion of the depletion layer can be prevented more effectively.

It is desirable that as shown in FIG. 16B the protrusions and recesses 1602 (corresponding to a bone portion of the fishbone shape) are formed such that the protrusions of one impurity region overlap with those of the adjacent impurity region (see portion 1603 in FIG. 16B).

However, in this structure, it is unavoidable that the movement distance of carriers is increased because they move along a path indicated by a broken line 1604. The increased movement distance would increase the carrier scattering probability, which may in turn reduce the mobility.

However, in very fine semiconductor devices for which the invention is effective, a small increase in movement distance would not much increase the influence of the impurity scattering as long as the channel forming region is intrinsic or substantially intrinsic. Suppressing the influences of the short channel effects (particularly the punch-through phenomenon) due to the miniaturization is more important than the above issue.

As for each impurity region, it is necessary to control the distance (represented by Lpa in FIG. 18B) between adjacent protrusions. The distance Lpa should be shortened to enhance the pinning effect, and should be elongated if increase in mobility is considered more important. In the invention, the distance Lpa is controlled so as to fall within a range of 70–3,000Å (preferably 100–1,000 Å).

In the structure of FIG. 16B, the width and the length of the regions (carrier movement regions, potential slit regions) 1605 other than the impurity regions influence the carrier mobility.

Figure 16C:
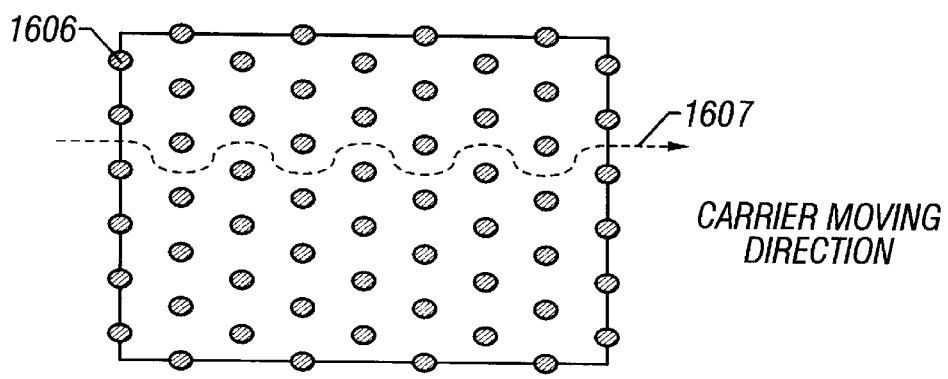

The invention may have variations in the case of the dot-patterned impurity regions as well as the linearly patterned ones. For example, impurity regions 1606 may be arranged alternately as shown in FIG. 16C.

In this structure, since the dot-shaped impurity regions 1606 on one column are located on lines connecting the gaps of the dot-shaped impurity regions 1606 on the adjacent columns, the effect of preventing the expansion of a depletion layer is enhanced. Although the carrier movement path is increased as indicated by a broken line 1607, it is not a serious problem in fine semiconductor devices as described above.

Figure 16D:
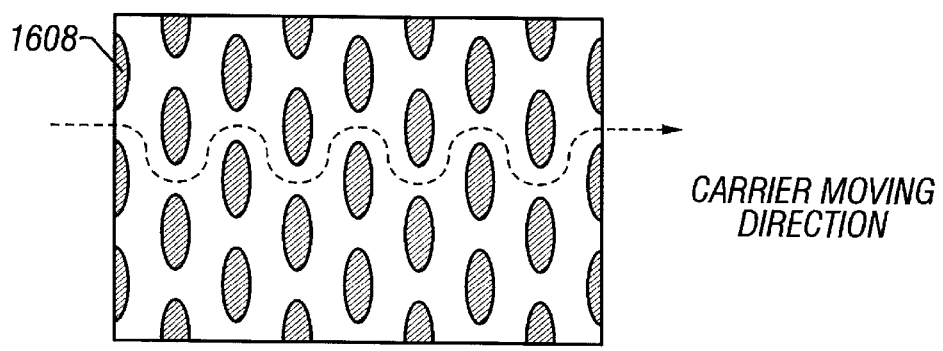

FIG. 16D shows a structure in which dot-patterned impurity regions 1608 have an elliptical shape (or a rectangular shape) whose major axis is perpendicular to the channel direction. This structure is effective in a case where preventing the expansion of an depletion layer is most important.

As described above, the punch-through phenomenon as one of the short channel effects can be prevented effectively by properly shaping the impurity regions. Since the impurity regions are formed artificially, their shape can be designed freely as a manufacturer desires.

In particular, the shapes of this embodiment shown in FIGS. 16A–16D are effective in manufacturing extremely fine semiconductor devices having a channel length of less than 0.1 $\mu$m. This is because the reduction in breakdown voltage due to the punch-through phenomenon is fatal to such fine devices and hence weight should be given to increase in breakdown voltage rather than increase in mobility.

Embodiment 5

This embodiment relates to structures of impurity regions that are different from those of Embodiment 4. This embodiment will be described with reference to FIGS. 17A–17D.

Figure 17A:
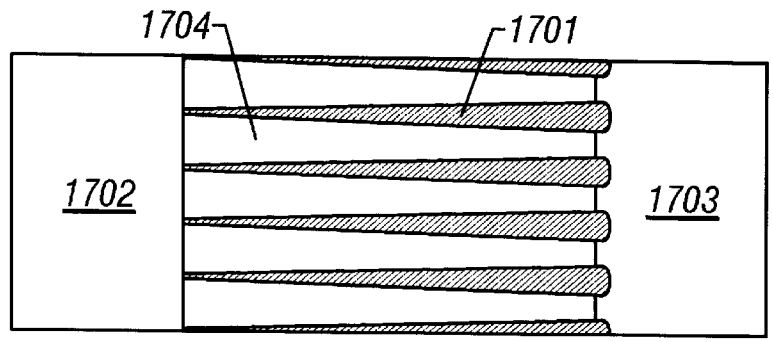
FIGS. 17A–17D show structures of impurity regions according to a fifth embodiment of the invention.

FIG. 17A shows a structure in which the total width $W_{pi}$ of impurity regions 1701 in the vicinity of a source region 1702 is different from that in the vicinity of a drain region 1703. More specifically, the total width $W_{pi}$ is gradually increased as the position approaches the drain region 1703.

With the structure of FIG. 17A, the expansion of the drain-side depletion layer, which is a case of the punch-through phenomenon as one of the short channel effects, can be suppressed effectively. On the source region side, carriers move smoothly because the total width $W_{pa}$ of potential slit region 1704 is sufficiently large.

Figure 17B:
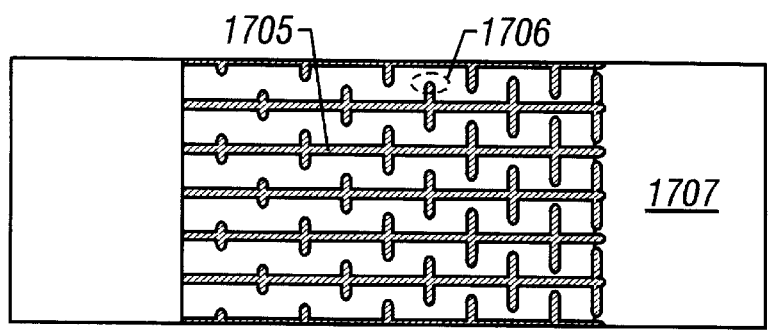

This type of structure can also be realized by forming fishbone-shaped impurity regions 1705 such that protrusions and recesses 1706 become longer as the position approaches a drain region 1707 as shown in FIG. 17B.

Figure 17C:
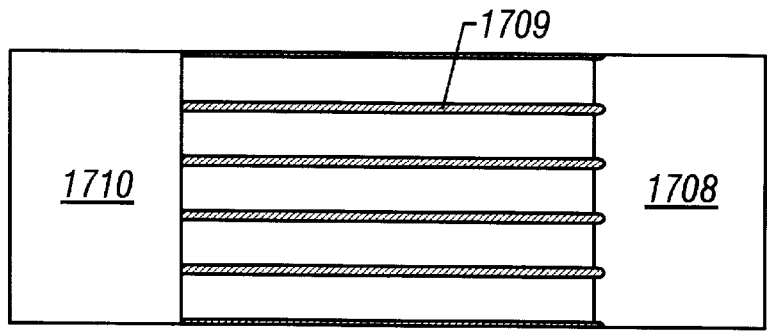

FIG. 17C shows a structure in which the concentration of an impurity element for constituting impurity regions 1709 is set high in the vicinity of a drain region 1708. As shown in FIG. 17C, the impurity regions 1709 are formed in linear patterns from a source region 1710 to the drain region 1708.

Figure 17D:
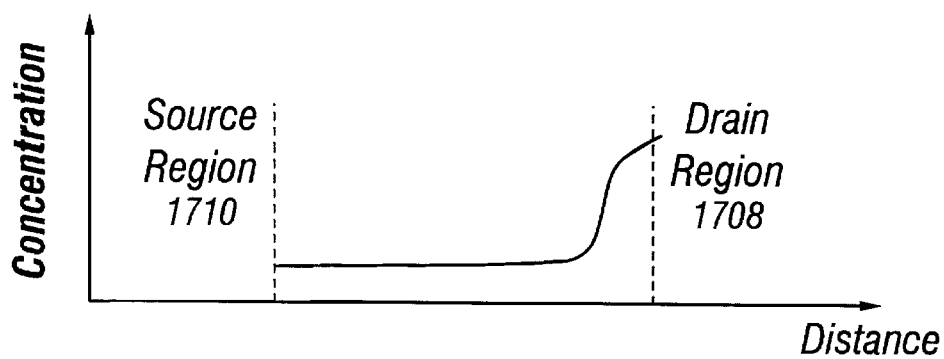

FIG. 17D is a graph showing a variation of the impurity element concentration in the impurity regions 1709 in which the horizontal axis represents the distance and the vertical axis represents the concentration. As seen from FIG. 17D, the concentration of an impurity element for constituting the impurity regions 1709 is set higher than in the vicinity of the source region 1710 than in the vicinity of the drain region 1708.

To provide a concentration profile shown in FIG. 17D in which the concentration in the vicinity of the source region 1710 is different from in the vicinity of the drain region 1708, the concentration of the impurity element may be adjusted properly in forming the impurity regions 1709.

A manufacturer need not stick to the impurity element concentration profile of FIG. 17D, but may determine a concentration profile by properly adapting an impurity adding process when necessary.

The structure of this embodiment are effective in a case where the source and drain regions are fixed. For example, this embodiment is not necessarily effective for a semiconductor device for driving a pixel of a liquid crystal display device in which case the source and the drain are reversed in accordance with a charging/discharging operation. Where the semiconductor device of this embodiment is applied to liquid crystal display device, it should be used in a circuit in which the source and the drain are fixed, such as an invertor circuit that constitutes a peripheral driver circuit.

Although this embodiment is directed to the impurity regions as variations of the linearly patterned impurity regions that are generally parallel with the channel direction, the concept of this embodiment can easily be applied to the dot-patterned impurity regions. As so exemplified, this embodiment is just an example and a manufacturer would employ other various conceivable structures when necessary.

Embodiment 6

The invention is characterized in that the impurity regions are provided in the channel forming region artificially and locally. An impurity element (one or a plurality of elements selected from carbon, nitrogen, and oxygen) locally added to the channel forming region is effective in the case of using a low oxygen concentration silicon substrate that has been subjected to hydrogen annealing.

As described in the background section, semiconductor devices (excluding a thyristor) for constituting ordinary LSI circuits are manufactured by using a silicon substrate that is formed by the CZ method and such a silicon substrate contains a given amount of oxygen for reduction of stress. However, in recent years, as increase in the breakdown voltage of oxide films and reduction of microdetects are required increasingly, substrates in which the oxygen concentration is reduced to less than $1 \times 10^{17}$ atoms/cm$^3$ in a surface layer of about 5 $\mu$m in thickness by annealing in a hydrogen atmosphere come to be used many cases.

On the other hand, in such silicon substrates that have been subjected to a low oxygen concentration treatment, there is a possibility that the surface layer becomes too weak to withstand stress and a crack and a warp tend to occur more easily in a manufacturing process of semiconductor devices.

In contrast, if a silicon substrate that has been subjected to a low oxygen concentration treatment is used in practicing the invention, stress concentrates at the impurity regions formed in the channel forming region. Thus, the impurity regions serve as buffer regions for buffering stress that occurs in a crystalline semiconductor.

The effect that the impurity regions serve as stress buffering regions is one of the invention's advantages worthy of mention. This effect is particularly remarkable when oxygen is used as an impurity element.

Thus, when semiconductor devices are manufactured by using a silicon substrate that has been subjected to a low oxygen concentration treatment, the influence of stress occurring in the manufacturing process can be reduced, as a result of which the manufacturing yield can be increased greatly.

In addition to increase in the breakdown voltage of an oxide film and reduction of microdefects, reduction in the influence of impurity scattering of carriers is expected in the above type of silicon substrate. That is, reducing the oxygen concentration means that the potential slit regions are made closer to intrinsic or substantially intrinsic regions, and therefore the carrier mobility can be made extremely high.

Embodiment 7

In this embodiment, examples of integrated circuits (covered by the term "semiconductor device" as used in this specification) that use semiconductor devices (or elements) according to the invention. This embodiment will be described with reference to FIGS. 18A–18B and 19A–19B.

Figure 18A:
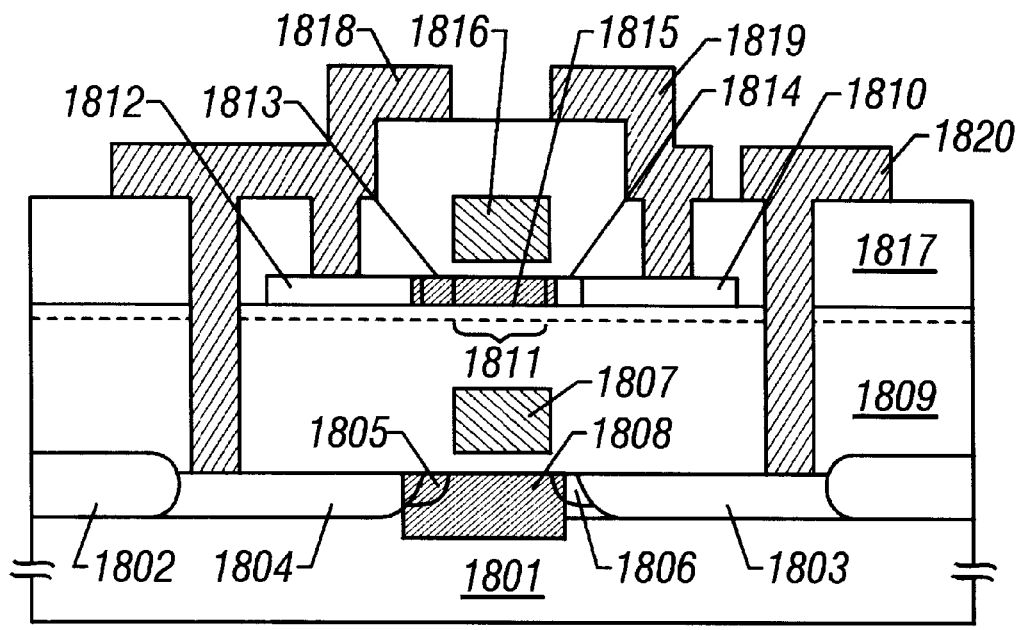
FIGS. 18A–18B and 19A–19B show configurations of semiconductor devices according to a seventh embodiment of the invention.

FIG. 18A shows an example in which the invention is applied to a stacked CMOS circuit formed by laying an n-channel FET and a p-channel FET in two stages. From the viewpoint of operation performance, it is common that a p-channel FET is formed in the lower layer, which is also the case in this embodiment.

Referring to FIG. 18A, a p-channel FET is formed in the lower layer by an ordinary IC technology. Reference numeral 1801 denotes an n-type silicon substrate; 1802, a field oxide film; 1803, a source region; and 1804, a drain region. In this embodiment, low-concentration impurity regions (the one on the drain region side is called a LDD region) 1805 and 1806 are formed.

Reference numeral 1807 denotes a gate electrode made of conductive polysilicon. Impurity regions 1808 which is the feature of the invention are formed right under the gate electrode 1807. In the example of FIG. 18A, one ends of the impurity regions 1808 are located in the low-concentration impurity region 1806 and the other ends are located in the drain region 1804 past the LDD region 1805.

An n-channel FET is formed in the upper layer by using the SOI technology. A single crystal silicon layer as the active layer of the n-channel FET is obtained by using a known wafer bonding technique. Therefore, an interlayer insulating film 1809 is a lamination film of an interlayer insulating film that covers the lower layer FET and a thermal oxidation film of the wafer bonded, and hence includes a bonding surface (indicated by a broken line).

Then, a source region 1810, a channel forming region 1811, and a drain region 1812 are formed by a known TFT technique. Also in this case, low-concentration impurity regions 1813 and 1814 are formed such that a channel forming region 1811 are interposed in between. Impurity regions 1815 according to the invention are formed in the channel forming region 1811.

After an interlayer insulating film 1817 is formed so as to cover a gate electrode 1816, interconnections 1818–1820 are formed. The interconnection 1818 is common to the drain region 1804 of the p-channel FET and the drain region 1812 of the n-channel FET.

The stacked CMOS circuit having the above-described structure of FIG. 18A can reduce the device occupation area, and therefore can increase the degree of integration when used in constructing a VLSI or a ULSI.

Since the use of the invention allows pursuit of high-speed operation without lowering the breakdown voltage, it becomes possible to provide a CMOS circuit superior in frequency characteristic.

Figure 18B:
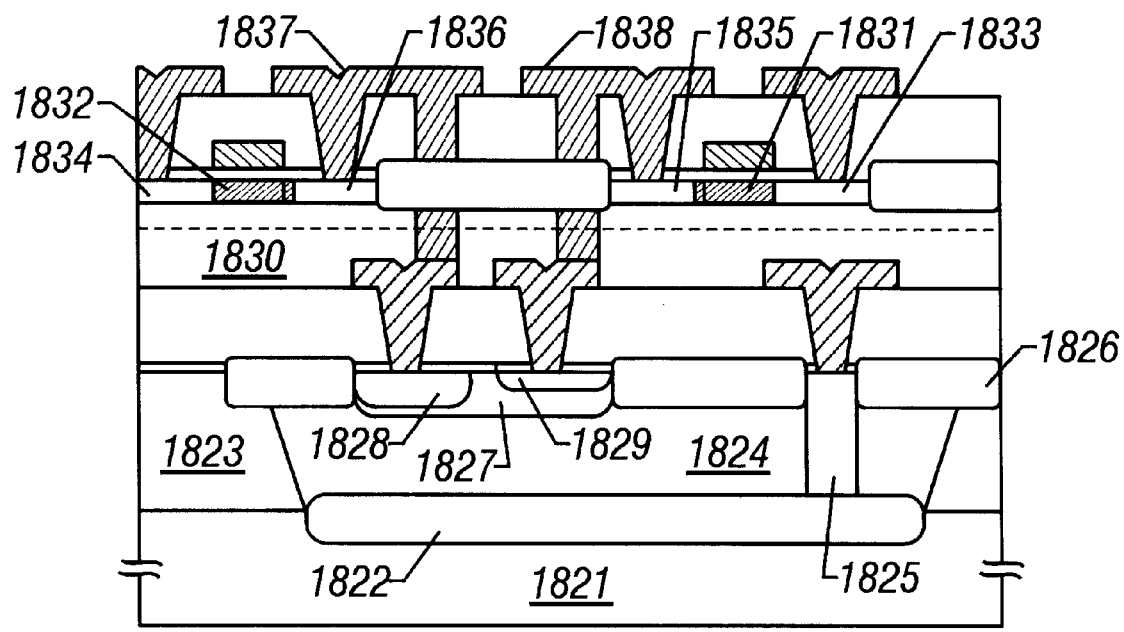

Next, FIG. 18B shows an example in which the invention is applied to a Bi-CMOS circuit that is a composite circuit of a CMOS circuit and a bipolar transistor. A bipolar transistor is formed in the lower layer and a CMOS circuit including semiconductor devices of a SOI structure is formed in the upper layer.

Referring to FIG. 18B, reference numeral 1821 denotes a p$^-$ type silicon substrate; 1822, a buried n$^+$ region; and 1823, a p-well formed by epitaxial growth. A portion of the p-well 1823 located over the buried n$^+$ region 1824 has been doped with an n-type impurity has turned to an n-well 1824 serving as a collector. Reference numeral 1825 denotes a deep n$^+$ region as a lead-out electrode for the buried n$^+$ region 1822. Reference numeral 1826 denotes a field oxide film formed by an ordinary selective oxidation method.

To form the bipolar transistor in the n-well 1824, a p$^-$ type region 1827 as an active base is formed first and then a p+region 1828 as an external base and an n$^+$ region 1829 as an emitter region are formed.

The CMOS circuit of a SOI structure which has, as the active layer, the single crystal silicon layer obtained by the wafer bonding technique is formed over the above-configured bipolar transistor. An interlayer insulating film 1830 includes the bonding surface (indicated by the broken line). Since the CMOS circuit is not described here in detail because the sufficient description therefor has already been described made in Embodiment 1.

In the configuration of FIG. 18B, both of impurity regions 1831 of an n-channel FET and impurity regions 1832 of a p-channel FET are formed so as to go into drain regions 1835 and 1836 but do not go into source regions 1833 and 1834, respectively.

The upper-layer CMOS circuit and the lower-layer bipolar transistor are connected to each other by interconnections 1837 and 1838, to complete a Bi-CMOS structure.

The circuit configuration of the above Bi-CMOS circuit is intended to effectively utilize the high-speed operation of the bipolar transistor and the low power consumption of the CMOS circuit. By employing, as in this embodiment, a three-dimensional structure in which a CMOS circuit and a bipolar transistor are laminated, the occupation area can greatly be reduced, that is, a prior art problem of a large occupation area can be solved.

Figure 19A:
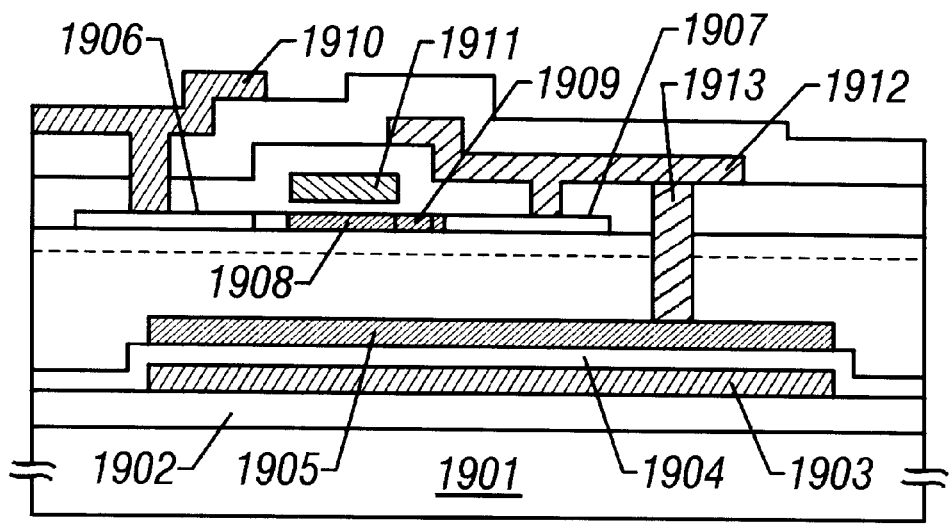

FIG. 19A shows an example in which the invention is applied to a DRAM (dynamic random access memory) manufactured by the SOI technology. The DRAM is a memory which stores information in a capacitor in the form of charge. Input/output of charge (information) is controlled by a semiconductor device (field-effect transistor) that is connected in series to the capacitor. This embodiment is directed to a case of using a stacked capacitor type DRAM.

Referring to FIG. 19A, reference numeral 1901 denotes a silicon substrate, and 1902 denotes an insulating film for isolating the silicon substrate 1901 from a charge storage electrode 1903 located above it. A capacitor electrode 1905 is provided over the charge storage electrode 1903 via an insulating film 1904 made of a large dielectric constant material. Although the insulating film 1904 is made of $Ta_2O_5$ in this embodiment, $Si_3N_4$ and like materials may also be used.

With the above structure, a capacitor having a large capacitance is formed between the capacitive storage electrode 1903 and the capacitor electrode 1905. The laminate structure of FIG. 19A has a feature that the lower layer is solely used as a charge storing region. Input/output of charge to/from the capacitor is performed by an IG-FET formed in the upper layer by the SOI technology.

In this embodiment, an n-channel FET having an LDD region is used as a semiconductor device for data signal control provided in the upper layer. Although in this embodiment a single crystal silicon layer as the active layer is obtained by a wafer bonding technique, it may be obtained by a polysilicon (or amorphous silicon) recrystallization technique that uses laser light or an electron beam. A bonding junction interface is indicated by a broken line in FIG. 19A.

The active layer, i.e., the single crystal silicon layer, includes a source region 1906 and a drain region 1907. Impurity regions 1908 according to the invention are formed in a channel forming region. The impurity regions 1908 are formed so as to penetrate through an LDD region 1909 and go into the drain region 1907.

A data signal sent via a bit line 1910 is supplied to a drain electrode 1912 by controlling the voltage of a word line 1911. The signal is then stored in the lower-layer capacitor via a buried plug 1913 that connects the drain electrode 1912 in the upper layer and the capacitor electrode 1905 in the lower layer.

The DRAM is suitable for construction of a high integration density, large-scale memory because each memory unit is constituted of a very small number of elements, i.e., an IG-FET and a capacitor. With an additional advantage of a low manufacturing cost, the DRAM is a circuit that is currently used in a largest quantity.

Figure 19B:
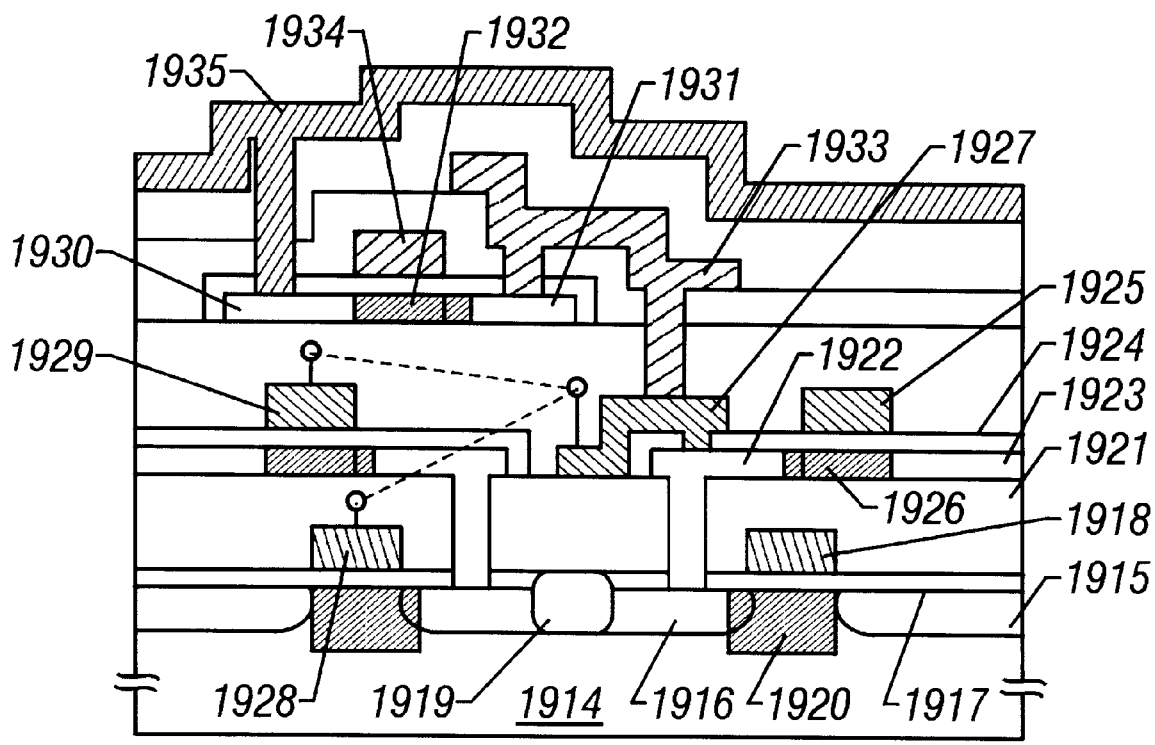

FIG. 19B shows an example in which FETs according to the invention are used in a SRAM (static random access memory).

The SRAM is a memory in which a bistable circuit such as a flip-flop is used as a storage element and which stores a binary information value (0 or 1) in accordance with the bistable state (on/off or off/on) of the bistable circuit. The SRAM is advantageous in being capable of holding information as long as it is supplied with a voltage.

The storage circuit is constituted of NMOS circuits or CMOS circuits. FIG. 19B is a sectional view of a cell as a combination of CMOS circuits of a SRAM. Both FETs in the lowermost layer are p-channel FETs and both FETs in the intermediate layer are n-channel FETs. Therefore, the following description will be basically directed to the two upper and lower FETs on the right-hand side of FIG. 19B.

Referring to FIG. 19B, a source region 1915 and a drain region 1916 which are p-wells are formed in an n-type silicon substrate 1914, and a gate electrode 1918 is formed above the n-type substrate 1914 through a gate insulating film 1917. The elements located on the right-hand side (as viewed in FIG. 19B) are isolated from those located on the left-hand side by a field oxide film 1919.

Reference numeral 1920 denotes impurity regions according to the invention. In this embodiment, the impurity regions 1920 are formed so as to go into the drain region 1916 but do not go into the source region 1915.

The active layer of the n-channel FET in the intermediate layer is formed by a laser (or electron) beam recrystallization method which is part of the SOI technology. More specifically, a polysilicon or amorphous silicon film is formed on a planarized interlayer insulating film 1921, melted by a laser beam, an electron beam, or the like, and then recrystallized.

Although another technique of the SOI technology, such as the wafer bonding technique, may naturally be used, in this embodiment the recrystallization method allows the drain region 1922 of the intermediate-layer n-channel FET to be directly connected to the drain region 1916 of the p-channel FET.

A source region 1923 and a drain region 1922 are formed in the above-obtained active layer (single crystal silicon layer) by a known TFT technique, and a gate electrode 1925 is formed above it through a gate insulating film 1924. Impurity regions 1926 according to the invention are formed right under the gate electrode 1925 so as to go into only the drain region 1922.

The gate electrode 1925 of the n-channel FET is formed by using polysilicon that is rendered conductive, and an interconnection 1927 is formed at the same time as the gate electrode 1925 by using the same material. The interconnection 1927 serves to supply an output signal of the right-hand CMOS circuit to gate electrodes 1928 and 1929 of the left-hand CMOS circuit. In FIG. 19B, broken lines indicate that the interconnection 1927 is electrically connected to the gate electrodes 1928 and 1929, a structure for which connection is not shown in the drawing.

An n-channel FET serving as a transfer gate is provided in the uppermost layer. The active layer of this FET is a single crystal silicon layer obtained by the wafer bonding technique. After a single crystal silicon layer is processed into an island shape, a source region 1930, a drain region 1931, and impurity regions 1932 according to the invention are formed therein to provide the active layer.

The drain region 1931 of the n-channel FET to serve as a transfer gate is electrically connected to the intermediate-layer interconnection 1927 via a connection electrode 1933. By applying a voltage to a word line 1934, a data signal is supplied from a bit line 1935 to the CMOS circuits.

Having advantages of a large operation margin and an extremely small data holding current, the CMOS-type SRAM configured in the above-described manner is widely used for a low-voltage battery backup purpose. The SRAM has further advantages such as high-speed operation, high reliability, and easiness in incorporation into a system.

As described above, by virtue of the invention the semiconductor devices of this embodiment such as the Bi-CMOS circuit and the SRAM circuit can be miniaturized while the short channel effects are avoided, and therefore they allow simultaneous pursuit of both high reliability (such as a high breakdown voltage) and high-speed operation. That is, it can be said that the invention is very effective in realizing ultra-high integration density circuits in view of the system-on-chip concept which will be put into practice in the future.

Embodiment 8

This embodiment is directed to a case where a semiconductor device according to the invention is incorporated into a product (electronic apparatus), specifically an IC circuit incorporated in a notebook-sized personal computer. This embodiment will be described with reference to FIG. 20.

Figure 20:
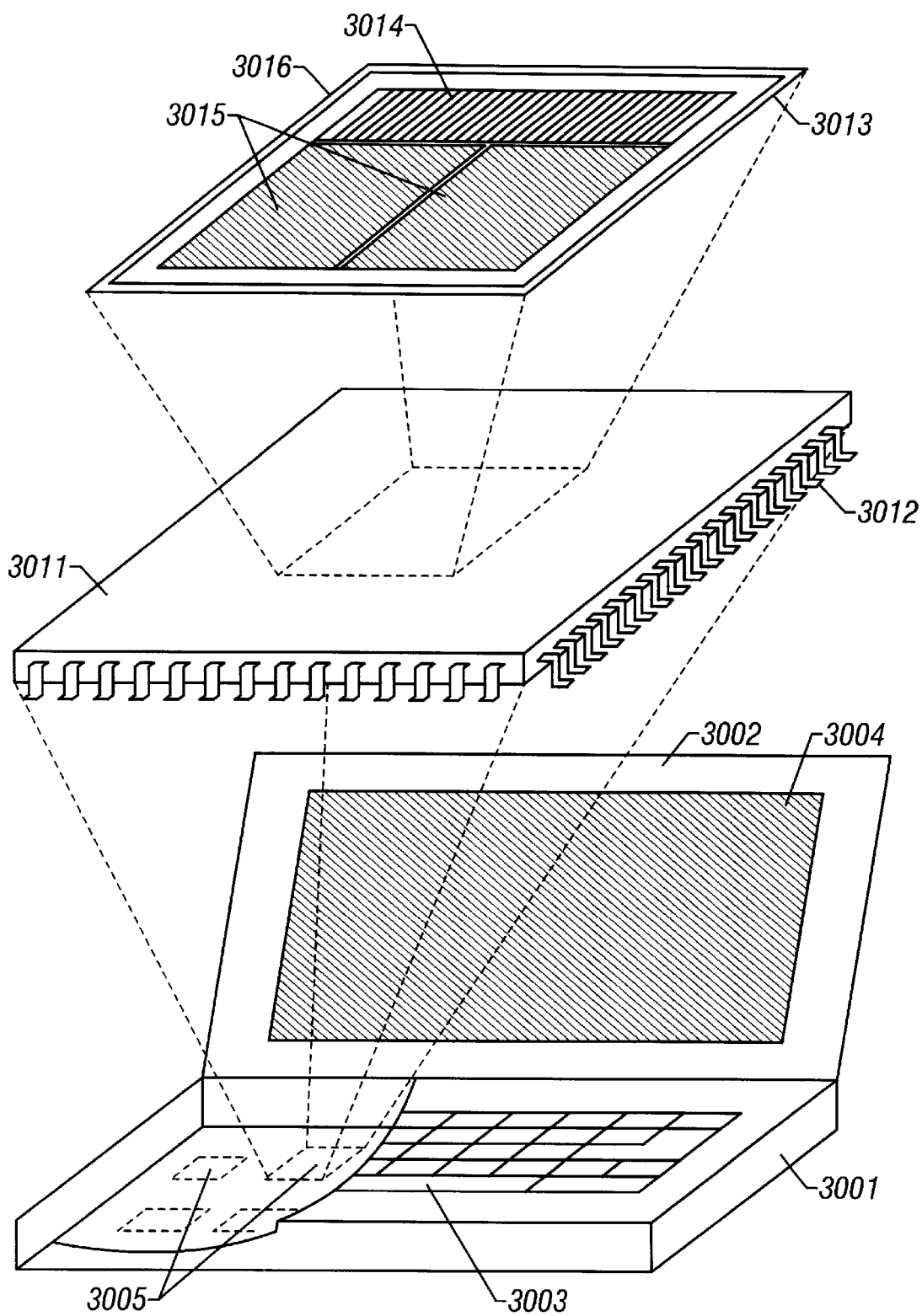
FIG. 20 shows an electronic apparatus (eighth embodiment) using semiconductor devices according to the invention.

Referring to FIG. 20, reference numeral 3001 denotes a main body; 3002, a lid; 3003, a keyboard; and 3004, an image display section. Various integrated circuits 3005 are incorporated in the main body 3001.

FIG. 20 shows one of the integrated circuits 3005 taken out of the apparatus. A semiconductor chip is protected by a resin or the like and covered with a package 3011. The semiconductor chip is to be connected to the external circuits via leads 3012. As for the integrated circuit (IC chip) 3005, usually, one can see only the black package 3011 and the leads 3012 and hence the integrated circuit 3005 is entirely a black box.

FIG. 20 also shows the semiconductor chip taken out of the protective package 3011. For example, the semiconductor chip is configured in the following manner. A computing section (processor) 3014 and memory sections 3015 are provided on a substrate 3013. Reference numeral 3016 denotes a bonding section for connecting semiconductor devices to the leads 3012.

The computing section 3014 and the memory sections 3015 are constructed by using a CMOS circuit, a Bi-CMOS circuit, a DRAM circuit, a SRAM circuit, and other various types of circuits. The configuration of this embodiment shown in FIG. 20 is characterized in that the computing section 3014 and the memory sections 3015 are formed on the same substrate, which is according to what is called the system-on-chip (system IC) concept.

In the configuration in which the computing section 3014 and the memory sections 3015 are arranged adjacent to each other, exchange of data between the computing section 3014 and the memory sections 3015 can be performed at very high speed. Thus, a circuit that operates at high speed can be constructed.

Further, all the necessary circuits can be integrated on one chip, in which case the manufacturing cost can be reduced very much. In addition, a product can be miniaturized by reducing the occupation area. Allowing formation of a three-dimensional integrated circuit as described in the seventh embodiment, the SOI technology will no doubt provide even higher integration densities in the future.

Further, since by utilizing the invention IG-FETs and even integrated circuits can be miniaturized without being affected by the short channel effects, it is expected that application electronic apparatuses as semiconductor devices can further be miniaturized and made more suitable for portable use by realizing the above-mentioned one-chip configuration.

Embodiment 9

This embodiment is directed to examples of electronic apparatuses incorporating IG-FETs according to the invention and integrated circuits that are constructed by using such IG-FETs. As described above, although this specification uses the terms "IG-FET," "integrated circuit" "electronic apparatus," etc. for convenience of description, all of them are basically constructed by utilizing semiconductors and therefore should be covered by the term "semiconductor device."

In general, semiconductor devices (electronic apparatuses) to which the invention is applicable include all semiconductor devices that require an IC circuit. Thus, the application range of the invention is extremely wide and include devices that are used in most of human activities.

Specific examples of semiconductor devices are active electro-optical devices such as a liquid crystal display device, an EL display device, and a CL display device, a TV camera, a personal computer, a car navigation apparatus, a TV projection apparatus, a video camera, and a portable information terminal apparatus (personal digital assistant). The portable information terminal apparatus includes such semiconductor devices as a cellular telephone and a mobile computer. FIGS. 21A–21D show typical examples of the above semiconductor devices.

FIG. 21A shows a TV camera which consists of a main body 2001, a camera section 2002, a display device 2003, and manipulation switches 2004. The invention can be applied to an integrated circuit 2005 that is provided inside the apparatus.

FIG. 21B shows a car navigation apparatus which consists of a main body 2101, a display device 2102, manipulation buttons 2103, and an antenna 2104. The invention can be applied to an integrated circuit 2105 that is provided inside the apparatus. Although the display device 2102 is used as a monitor, the allowable resolution range is relatively wide because the main purpose is display of a map.

FIG. 21C shows a portable information terminal apparatus (cellular telephone) which consists of a main body 2301, a voice output section 2302, a voice input section 2303, a display device 2304, manipulation buttons 2305, and an antenna 2306. The invention can be applied to an integrated circuit 2307 that is provided inside the apparatus.

The cellular telephone of FIG. 21C is a semiconductor device that should operate in a high frequency range, it is required to operate at very high speed. The invention enables incorporation of an integrated circuit that can operate at high speed while its breakdown voltage is not lowered.

FIG. 21D shows a video camera which consists of a main body 2401, a display device 2402, an eyepiece unit 2403, manipulation buttons 2404, and a tape holder 2405. The invention can be applied to an integrated circuit 2406 that is provided inside the apparatus. An image to be taken is displayed on the display device 2402 and can be viewed through the eyepiece unit 2403 on a real-time basis. Therefore, a user can take a picture while watching a displayed image.

As described above, the application range of the invention is very wide; the invention can be applied to various types of semiconductor devices (including electronic apparatuses) having a semiconductor integrated circuit.

Embodiment 10

A semiconductor device according to the invention exhibits much superior electrical characteristics, and an integrated circuit constructed by using such semiconductor devices is given a frequency characteristic covering a sufficiently high frequency range. In this embodiment, a description will be made of examples of performance of semiconductor devices according to the invention.

A semiconductor element itself formed according to the invention exhibits a much superior device characteristic (current-voltage characteristic of an IG-FET), and the threshold voltage $V_{th,n}$ of an n-channel FET and the threshold voltage $V_{th,p}$ of a p-channel FET can be controlled for a necessary drive voltage in ranges of –0.3 to 3.0 V and –3.0 to 0.3 V (typically 0 to ±0.3 V), respectively. A much superior subthreshold characteristic can also be obtained in which the S-value is 60–85 mV/decade, in some cases 60–70 mV/decade.

Further, for the reasons described in the first embodiment, a high mobility (larger than 1,000 cm$^2$/V.s) can be obtained. In calculating a mobility value based on a calculation formula, care should be given to the fact that the mobility is in inverse proportion to the channel width W. In practicing the invention, an actual mobility value cannot be obtained unless a measured channel width $W_{pa}$ is substituted into a formula because the channel width is narrowed by impurity regions by not a small amount.

A much superior frequency characteristic can be obtained by constructing an integrated circuit by using semiconductor devices according to the invention that can attain the above-mentioned superior electrical characteristics. For example, by constructing a 9-stage ring oscillator by using semiconductor devices according to the invention, a frequency characteristic covering 2–10 GHz can be obtained with a drive voltage of 3.3 V.

The invention is also effective for electronic apparatuses that are required to have a frequency characteristic covering a high frequency range, such as a cellular telephone as a high-frequency electronic apparatus. An integrated circuit used in an input section, for instance, of a cellular telephone is required to have a frequency characteristic including about 2 GHz (2.4 GHz) as in the case of an I/O circuit and a MUX/DMUX circuit. The invention can sufficiently be applied to such high-frequency integrated circuits.

Embodiment 11

This embodiment is directed to a configuration in which the same element as an impurity element for forming impurity regions for pinning is added to a base insulating layer (or an insulating substrate) of a single crystal silicon layer (active layer). This embodiment can be applied to both configurations of FIGS. 1A–1C and 15A–15C.

This embodiment is directed to a case where an n-type semiconductor device is to be formed and the impurity regions are formed by adding boron. (In the case of a p-type semiconductor device, phosphorus (or arsenic) may be added.)

Figure 22A:
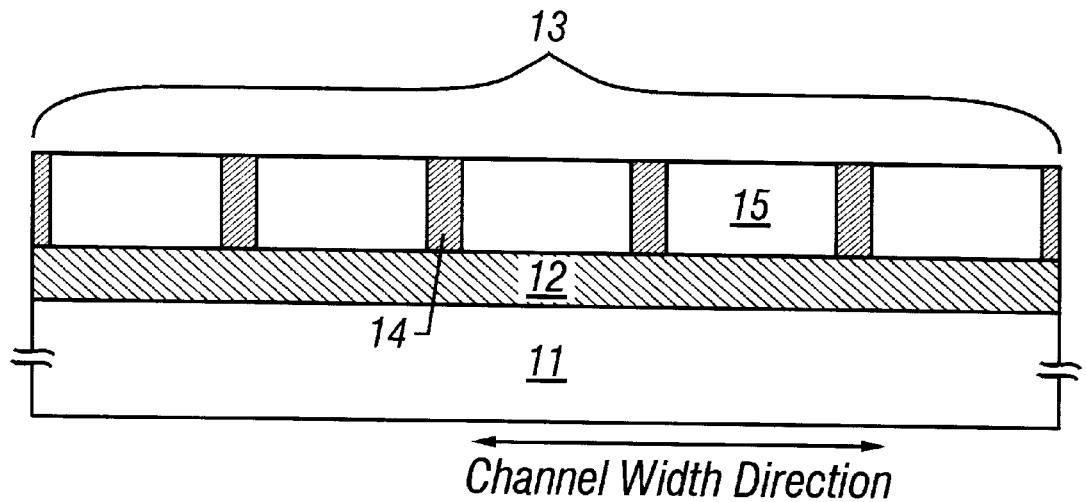
FIGS. 22A–22C show a configuration and energy profiles of a channel forming region of a semiconductor device according to an eleventh embodiment of the invention.

FIG. 22A is a sectional view taken by cutting a channel forming region by a plane perpendicular to the channel direction. Thus, during operation, carriers (electrons or holes) move in the direction perpendicular to the paper surface.

Referring to FIG. 22A, reference numerals 11 and 12 denote a substrate and an insulating layer (in this embodiment, an oxide film), respectively. A single crystal silicon layer 13 serving as an active region is formed on the insulating layer 12. Boron is locally added to the single crystal silicon layer 13 to form impurity regions 14 for pinning and channel forming regions 15.

This embodiment is characterized in that the insulating layer 12 contains boron at least in the vicinity of its surface. This structure may be formed in various manners depending on the manufacturing process of a SOI structure. A brief description will be made of a case of a wafer bonding SOI structure.

In the case of a wafer bonding SOI structure, a silicon substrate (first substrate) on which a thermal oxidation film is formed and a silicon substrate (second substrate) for supporting it are prepared. A thermal oxidation process for forming a thermal oxidation film on the first substrate is executed in an atmosphere containing boron. As a result, boron is added to a resulting thermal oxidation film.

Then the first and second substrates are bonded together by a known method, and an etch-back operation (or grinding) is performed from the back side of the first substrate. Thus, a SOI structure is obtained.

Then, boron is locally added by ion implantation, for instance, so that impurity regions for pinning are formed. Thus, the structure shown in FIG. 22A is obtained.

Figure 22B:
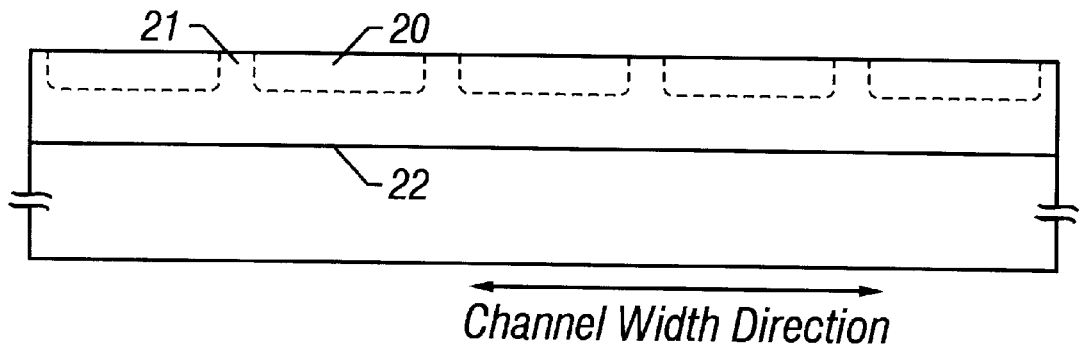

FIG. 22B schematically shows an energy profile of the structure of FIG. 22A, in which reference numeral 20 denotes regions of low energy wall that correspond to the channel forming regions 15.

The impurity regions 14 for pinning and their vicinities correspond to a high energy wall region 21 (energy barrier region). Reference numeral 22 denotes an interface between the single crystal silicon layer 13 and the insulating layer 12. This embodiment is characterized in that a high energy barrier is intentionally formed in the vicinity of the interface 22.

As described in the first embodiment, high energy barriers are formed in the impurity regions 14 and encompass their vicinities because of impurity leakage. The same thing applies to the insulating layer 12 which contains boron; naturally a high energy barrier is formed at and in the vicinity of the interface 22 between the single crystal silicon layer 13 and the insulating layer 12.

Thus, the high-energy wall region 21 (energy barrier) is formed as shown in FIG. 22B and carriers go through the other regions, i.e., the low-energy wall regions 20.

Figure 22C:
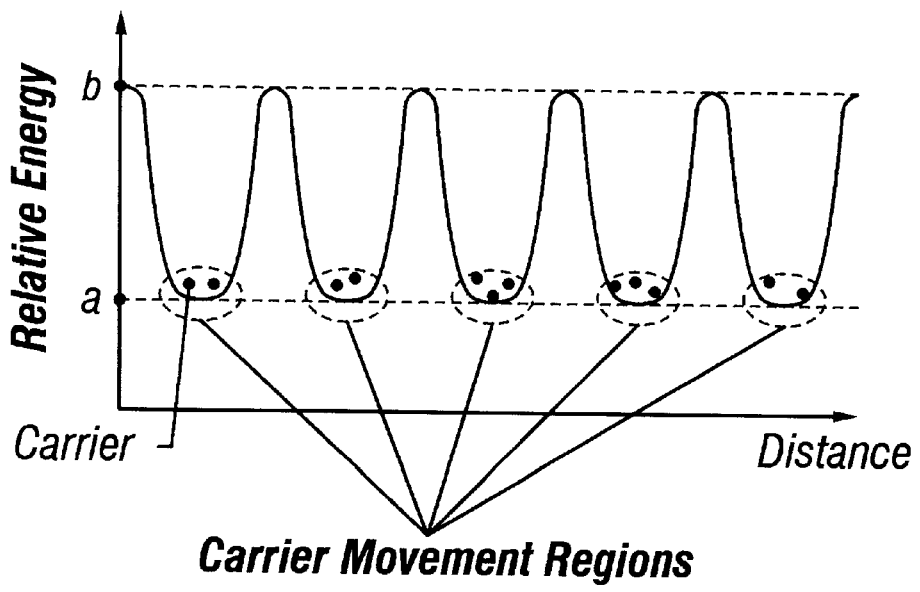

FIG. 22C shows an energy profile in the active region, in which the horizontal axis represents the distance in the channel width direction (direction traversing the channel) and the vertical axis represents the relative energy.

The energy profile diagrams of FIGS. 22B and 22C are drawn so as to correspond to each other. That is, the energy state of the low-energy regions 20 corresponds to that of carrier movement regions in FIG. 22C.

The relative energy is lowest (level a in FIG. 22C) at the inside of the low-energy wall regions 20 (particularly at the positions most distant from the impurity regions 14), and highest (level b in FIG. 22C) in and in the vicinity of the impurity regions 14 and at and in the vicinity of the interface 22, i.e., in the region 21.

In the invention, the relative energy a should be 3 or more times (preferably 10 or more times) larger than the relative energy b. In this case, carriers are allowed to go through the regions 20 with preference given thereto.

Since a high energy barrier is formed in the vicinity of the interface 22, no carriers go through the region in the vicinity of the interface 22. Therefore, surface scattering of carriers which would otherwise occur in the vicinity of the surface of the base insulating layer 12 can be prevented.

Although this embodiment is directed to the wafer bonding SOI structure, the advantages of this embodiment can be obtained as long as the structure of FIG. 22A is formed. That is, the invention can also be applied to SOI structures formed by other means.

Embodiment 12

The configuration of the eleventh embodiment can also be applied to a buried channel type semiconductor device. Further, although the eleventh embodiment is directed to the n-channel semiconductor device, the eleventh embodiment can easily be adapted for a p-type semiconductor device, and can be adapted even for a CMOS structure that is a complementary combination of n-type and p-type semiconductor devices.

In a certain situation, as for a substrate on which n-type semiconductor devices and p-type semiconductor devices are formed in a mixed manner, the configuration of the eleventh embodiment can be applied to only the n-type semiconductor devices.

As described above, since the invention is applied to semiconductor devices having a SOI structure, the invention enables formation of an integrated circuit that operates more than 10% faster and can be driven with more than 30% lower power consumption than a conventional integrated circuit formed on a bulk silicon substrate.

By utilizing the invention, the short channel effects can be prevented which would otherwise occur when the channel length is shortened. Specifically, a drain-side depletion layer is prevented from expanding to the source region and the region under the channel forming region by means of the impurity regions that are locally formed in the channel forming region, to provide a structure in which the drain voltage does not influence the energy (potential) state of the channel forming region. As a result, the punch-through phenomenon and deterioration of the subthreshold characteristic can be prevented, as well as a high drain breakdown voltage can be obtained.

Further, reduction in threshold voltage which is one aspect of the short channel effects can be compensated by increase in threshold voltage that is caused by the narrow channel effect. The narrow channel effect is artificially obtained by locally forming the impurity regions in the channel forming region according to the invention.

As described above, the invention allows even semiconductor devices in the deep submicron range that have extremely short channels to operate properly without causing any short channel effects. Thus, by using semiconductor devices according to the invention, integrated circuits can be constructed that are integrated at a very high density.

Further, according to the invention, it becomes possible to reduce scattering due to self-collision of carriers by defining carrier movement directions by forming slit-like lane regions in terms of energy.

That is, the factors of reducing the carrier mobility, such as the impurity scattering, the lattice scattering, and the scattering due to self-collision of carriers, are greatly reduced in degree, whereby the mobility is increased very much. Thus, the performance of semiconductor devices as typified by an IG-FET can further be improved.

What is claimed is:

1. An insulated-gate semiconductor device having an SOI structure, said device comprising:

a source region, a drain region and a channel forming region which are formed by using a crystalline semiconductor formed on an insulative substrate or an insulating layer; and a gate insulating film and a gate electrode formed on the channel forming region, said channel forming region comprising:
carrier moving regions; and
impurity regions formed artificially and locally for pinning of a depletion layer developing from the drain region toward the channel forming region and the source region, said impurity regions containing an impurity element for shifting an energy band in such a direction that movement of electrons is obstructed.

2. An insulated-gate semiconductor device having an SOI structure, said device comprising:

a single crystal semiconductor substrate;

an insulating layer in the single crystal substrate;

a crystalline semiconductor on the insulating layer;

a source region, a drain region, and a channel forming region being formed in the crystalline semiconductor, each of the source and drain regions including a first impurity; and a gate insulating film and a gate electrode being formed on the channel forming region, said channel forming region comprising:
a plurality of carrier moving regions; and
a plurality of impurity regions being formed artificially and locally for pinning of a depletion layer developing from the drain region toward the channel forming region and the source region, said impurity regions including a second impurity for shifting an energy band in such a direction that movement of holes is obstructed, wherein the second impurity has an opposite conductivity to the first impurity.

3. An insulated-gate semiconductor device having an SOI structure, said device comprising:
   a source region, a drain region and a channel forming region which are formed by using a crystalline semiconductor formed on an insulative substrate or an insulating layer; and
   a gate insulating film and a gate electrode formed on the channel forming region,
   said channel forming region comprising:
      carrier moving regions; and
      impurity regions formed artificially and locally by adding an impurity element to control a threshold voltage to a given value, said impurity element shifting an energy band in such a direction that movement of electrons is obstructed.

4. An insulated-gate semiconductor device having an SOI structure, said device comprising:
   a single crystal semiconductor substrate;
   an insulating layer in the single crystal substrate;
   a crystalline semiconductor on the insulating layer;
   a source region, a drain region and a channel forming region being formed in the crystalline semiconductor, each of the source and drain regions including a first impurity; and
   a gate insulating film and a gate electrode being formed on the channel forming region,
   said channel forming region comprising:
      a plurality of carrier moving regions; and
      a plurality of impurity regions being formed artificially and locally by adding a second impurity to control a threshold voltage to a given value, said second impurity shifting an energy band in such a direction that movement of holes is obstructed,
   wherein the second impurity has an opposite conductivity to the first impurity.

5. An insulated-gate semiconductor device according to any one of claims 1 and 3 wherein said impurity element is for forming a built-in potential difference locally in the channel forming region.

6. An insulated-gate semiconductor device according to claim 1 or 3 wherein said impurity element belongs to group 13.

7. An insulated-gate semiconductor device according to claim 6 wherein said impurity element is boron.

8. An insulated-gate semiconductor device according to claim 2 or 4 wherein said second impurity belongs to group 15.

9. An insulated-gate semiconductor device according to claim 8 wherein said second impurity is phosphorus or arsenic.

10. An insulated-gate semiconductor device according to any one of claims 1 to 4 wherein said carrier moving regions are intrinsic or substantially intrinsic.

11. An insulated-gate semiconductor device according to claim 10 wherein said substantially intrinsic regions mean regions in which in the vicinity of a surface of the crystalline semiconductor a concentration of an impurity element for imparting one type of conductivity to the crystalline semiconductor is less than $5 \times 10^{15}$ atoms/cm$^3$ and an oxygen concentration is less than $2 \times 10^{18}$ atoms/cm$^3$.

12. An insulated-gate semiconductor device according to claim 10 wherein said substantially intrinsic regions mean regions in which in the vicinity of a surface of the crystalline semiconductor a concentration of an impurity element for imparting one type of conductivity to the crystalline semiconductor is less than $5 \times 10^{15}$ atoms/cm$^3$ and an oxygen concentration is less than $1 \times 10^{17}$ atoms/cm$^3$.

13. An insulated-gate semiconductor device according to any one of claims 1 to 4 wherein a width W of the channel forming region, a total width $W_{pi}$ of the impurity regions, and a total width $W_{pa}$ of regions between the impurity regions satisfy relationships $W_{pi}/W=0.1$ to $0.9$, $W_{pa}/W=0.1$ to $0.9$, and $W_{pi}/W_{pa}=1/9$ to $9$.

14. An insulated-gate semiconductor device according to any one of claims 1 to 4 wherein in at least one cross-section taken by cutting the channel forming region in a direction perpendicular to a channel direction, the channel forming region is substantially regarded as a collection of a plurality of channel forming regions sectioned by the impurity regions.

15. An insulated-gate semiconductor device according to any one of claims 1 to 4 wherein a reduction in threshold voltage caused by a short channel effect occurring in the channel forming region during driving is compensated by an increase in threshold voltage caused by a narrow channel effect obtained by utilizing the impurity regions.

16. An insulated-gate semiconductor device according to any one of claims 1 to 4 wherein the impurity regions serve as regions for buffering stress that occurs in the crystalline semiconductor.

17. An insulated-gate semiconductor device according to any one of claims 1 to 4 wherein a total width of the carrier moving regions is within a range of 30 to 3,000 Å.

18. An insulated-gate semiconductor device according to any one of claims 1 to 4 wherein said impurity regions have dot patterns.

19. An insulated-gate semiconductor device according to any one of claims 1 to 4 wherein said impurity regions have linear patterns substantially parallel with a channel direction.

20. An insulated-gate semiconductor device according to claim 3 or 4 wherein said threshold voltage is controlled by controlling widths of the carrier moving regions.

21. The device of any one of claims 1 through 4 in combination with at least an electric apparatus selected from the group consisting of a liquid crystal display device, an EL display device, a CL display device, a TV camera, a personal computer, a car navigation apparatus, a TV projection apparatus, a video camera, and a portable information terminal apparatus including a cellular telephone and a mobile computer.

22. A device according to any one of claims 1 and 3 wherein said impurity element in said impurity regions is at a concentration of $1 \times 10^{17}$ to $1 \times 10^{20}$ atoms/cm$^3$.

23. A device according to any of claims 2 and 4, wherein the second impurity is for forming a built-in potential difference locally in the channel forming region.

24. A device according to any one of claims 2 and 4, wherein the second impurity in the impurity regions is at a concentration of $1 \times 10^{17}$ to $1 \times 10^{20}$ atoms/cm$^3$.

25. An insulating gate semiconductor device having an SOI structure, said device comprising:
   a single crystal semiconductor substrate;
   an insulating layer in the single crystal substrate;
   a single crystal semiconductor layer on the insulating layer;
   a source region, a drain region, and a channel forming region being formed in the single crystal semiconductor layer, each of the source and drain regions including a first impurity; and
   a gate electrode being formed over the channel forming region with a gate insulating film therebetween, said channel forming region comprising:
  a plurality of carrier moving regions; and
  a plurality of impurity regions each including a second impurity,
  wherein the second impurity has an opposite conductivity to the first impurity.

26. A device according to claim 25, wherein the insulated gate semiconductor device is an n-type insulated gate field effect transistor,
  wherein the first impurity is an n-type impurity while the second impurity is a p-type impurity.

27. A device according to claim 25, wherein the insulated gate semiconductor device is an n-type insulated gate field effect transistor,
  wherein the first impurity comprises phosphorus while the second impurity comprises boron.

28. A device according to claim 25, wherein the insulated gate semiconductor device is a p-type insulated gate field effect transistor,
  wherein the first impurity is a p-type impurity while the second impurity is an n-type impurity.

29. A device according to claim 25, wherein the insulated gate semiconductor device is a p-type insulated gate field effect transistor,
  wherein the first impurity comprises boron while the second impurity comprises at least one selected from the group consisting of phosphorus and arsenic.

30. A device according to claim 25, wherein the second impurity in the plurality of impurity regions is at a concentration of $1\times10^{17}$ to $1\times10^{20}$ atoms/cm$^3$.

31. A device according to claim 25, wherein a width W of the channel forming region, a total width $W_{pi}$ of the impurity regions, and a total width $W_{pa}$ of regions between the plurality of impurity regions satisfy relationships $W_{pi}/W=$ 0.1 to 0.9, $W_{pa}/W=$0.1 to 0.9, and $W_{pi}/W_{pa}=$1/9 to 9.

32. A device according to claim 25, wherein a total width of the plurality of carrier moving regions is within a range of 30 to 3,000 Å.

33. A device according to claim 25, wherein each of the plurality of impurity regions has a dot pattern.

34. A device according to claim 25, wherein each of the plurality of impurity regions has a linear pattern being parallel with a channel direction.

35. The device of claim 25 in combination with at least an electric apparatus selected from the group consisting of a liquid crystal display device, an EL display device, a CL display device, a TV camera, a personal computer, a car navigation apparatus, a TV projection apparatus, a video camera, and a portable information terminal apparatus including a cellular telephone and a mobile computer.

* * * * *